United States Patent
Ishimine et al.

(10) Patent No.: US 6,404,640 B1
(45) Date of Patent: Jun. 11, 2002

(54) LIQUID-COOLED ELECTRONIC APPARATUS

(75) Inventors: Junichi Ishimine; Masahiro Suzuki; Masahiro Miyo; Akihiko Fujisaki; Keizo Takemura; Jie Wie; Hisashi Kawashima; Yoshiaki Udagawa; Haruhiko Yamamoto; Masahiro Mochizuki, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/235,498

(22) Filed: Jan. 22, 1999

(30) Foreign Application Priority Data

Aug. 11, 1998 (JP) ............................................. 10-226906

(51) Int. Cl.[7] ................................................ H05K 7/20
(52) U.S. Cl. ........................ 361/720; 361/688; 361/689; 361/698; 361/699; 361/701; 361/719; 174/15.1; 165/80.4
(58) Field of Search ................................. 361/688–704, 361/707, 711, 715, 716, 719–721, 728, 729, 747; 174/15.1, 15.2, 16.1, 16.3; 165/80.3, 80.4, 104.33, 185

(56) References Cited

U.S. PATENT DOCUMENTS

| | | | | |
|---|---|---|---|---|
| 4,520,426 A | * | 5/1985 | Wessely | 361/704 |
| 4,748,495 A | * | 5/1988 | Kucharek | 361/702 |
| 4,825,337 A | * | 4/1989 | Karpman | 361/716 |
| 4,994,937 A | * | 2/1991 | Morrison | 361/715 |
| 5,406,807 A | * | 4/1995 | Ashiwake et al. | 361/699 |
| 5,646,824 A | | 7/1997 | Ohashi et al. | 361/699 |
| 5,859,763 A | * | 1/1999 | Nam et al. | 361/699 |
| 5,934,364 A | * | 8/1999 | Chrysler et al. | 165/170 |
| 6,053,238 A | * | 4/2000 | Goth et al. | 165/10 |

FOREIGN PATENT DOCUMENTS

DE    43 12 057 A1    10/1993

OTHER PUBLICATIONS

Kaneko et al. "Hardware Technology for Fujitsu VP2000 Series" Fujitsu–Scientific and Technical Journal, vol. 27, No. 2, Jun. 1999—pp. 158–168.

H. Wessely "Packaging System for High Performance Computer" IEEE, vol. SYMP. 6, Apr. 1989, pp. 83–89.

\* cited by examiner

*Primary Examiner*—Leo P. Picard
*Assistant Examiner*—Boris L. Chervinsky
(74) *Attorney, Agent, or Firm*—Armstrong, Westerman, Hattori, McLeland & Naughton, LLP

(57) ABSTRACT

An electronic apparatus including a motherboard, a plurality of multi-chip modules mounted to the motherboard and cooling members for cooling the multi-chip modules. A refrigeration unit is arranged to deliver cooling water to the cooling members. A connection structure is provided for each multi-chip module for thermally and mechanically releasably coupling each multi-chip module to the refrigeration unit.

8 Claims, 36 Drawing Sheets

LIQUID-COOLED ELECTRONIC APPARATUS

BACKGROUND OF THE INVENTION

1. Field of the Invention

The present invention relates to an electronic apparatus used in a computer system, or the like.

2. Description of the Related Art

A computer system comprises an arithmetic operation section with integrated arithmetic circuits, a cache section operating at a high speed, for processing instructions and data, so as not to reduce the processing capacity of the arithmetic operation section, a memory section for storing the instructions and data sent to the cache section, and peripheral units for reading programs and data from the memory. Also, a system having a plurality of arithmetic operation sections for concurrent operation comprises a common memory section accessible by a plurality of arithmetic operation sections. Especially, the arithmetic operation section and the cache section operate at a high clock frequency in order to improve the operating speed, and involve considerable data changes for large power consumption and heat generation.

Means for cooling these circuits include natural air cooling, forced air cooling, liquid cooling, immersion cooling, etc. Natural air cooling is low in cooling capacity and used for small computers which generate a small amount of heat. Forced air cooling and liquid cooling are used for computers having a high processing capacity. The main application of immersion cooling is to special computers, in test stages, using the Josephson device or the like.

The mainframe computer, as shown in FIG. 47, has a large arithmetic operation circuit, which is configured of a motherboard 201 having a plurality of LSIs 203 mounted thereon. This motherboard generates so much heat that it is cooled by a cooling plate which, in turn, is cooled by a cooling liquid. The cooling plate 206 includes bellows 207 on the portion thereof in opposed relation to the LSIs 203 which generate heat. These bellows 207 are brought into contact with the LSIs 203 to cool the latter. The refrigerant used for this cooling plate 206 is cooled down to about room temperature by a heat exchanger (not shown). The refrigerant absorbs the heat of the LSIs 203 and returns to a heat exchanger not shown. Also, the bellows 207 have a spring property to closely contact the LSIs 203, so that the LSIs 203 and the bellows 207 can thermally contact each other simply by mounting the cooling plate 206 at a predetermined position on the motherboard 201.

This apparatus has LSIs 203 mounted on the two sides of the motherboard 201, though not shown, in order to improve the package density. In order to cool the LSIs 203 mounted on the two sides, two cooling plates 206 are arranged on both sides of the motherboard 201. As a result, when the motherboard develops an abnormality or the requirement for replacement occurs due to the version up of hardware, it is necessary to remote the cooling plate 206 from the housing and then remove the motherboard 201.

Also, with the improvement in the performance of this apparatus and with the increase in the processing capacity of the LSI 203, more heat is generated. To increase the flow rate of the cooling water, however, a lower pressure resistance in the cooling plate, piping, etc. is required. However, the cooling plate, or the like, is arranged in a limited space and it is impossible to increase the size. If the temperature of the cooling water is decreased below room temperature, on the other hand, water drips attach to the motherboard, thereby causing a malfunction. The area at which the motherboard 201 and the cooling plate 206 are thermally connected to each other is limited to the contact area between the LSIs 203 and the bellows 207. To increase this area, a total change of the apparatus structure is required and this is difficult. For improving the cooling performance, therefore, the thermal resistance at the contact surface must be decreased. If the bellows 207 is pressed against the LSIs 203 with a greater force, the LSIs 203 and the motherboard 201 would be damaged. Also, a larger force would be required for mounting the cooling plate 206 for deteriorated maintainability. In view of this, a metal of low melting point is held between the LSIs 203 and the bellows 207 and melted to mount and demount the cooling plate. In this way, the contacting force is increased for a reduced thermal resistance.

As a result, each time the motherboard is replaced or the cooling plate is mounted or demounted, the bothersome labor of spraying hot air higher in temperature than the melting point of the metal between the motherboard and the cooling plate is required for a very deteriorated maintenance efficiency.

With the advance in CMOS techniques, the present-day mainframe computer uses forced air cooling using radiation fins 204, as shown in FIG. 48. A circuit as large as the arithmetic operation circuit mounted on the motherboard 201 in FIG. 47 is formed of one chip by the recently-developed micromachining technology. Thus, the arithmetic operation circuit which has conventionally been configured of a plurality of motherboards is now formed of a single multi-chip module 202. Further, the reduced size of the circuit has shortened the signal line and operation with higher clock frequency is made possible. At the same time, the power saving unique to the CMOS technique eliminates the need for liquid cooling. In this way, the operation capacity of each motherboard 201 has been remarkably improved while the conversion of the cooling method from liquid cooling to forced air cooling has improved the maintenance efficiency.

The change in cooling method from liquid cooling to forced air cooling has eliminated the need of installing the cooling plate and makes it possible to replace the motherboard directly. Also, since there is no need of piping work, the radiation fins can be divided into small units on the motherboard, and the radiation fin can be installed on each multi-chip module constituting a unit of parts on the motherboard. As a result, the multi-chip module can be handled with the radiation fin mounted thereon, and parts can be replaced without removing the cooling plate or the motherboard.

Even with the recent technological development, however, the reduction in circuit size and the operation at a high clock frequency due to the reduced circuit size have reached a limit. As disclosed in JP-A-1-318295, it is known that a semiconductor device can operate at a higher rate of reaction and a higher clock frequency, when the temperature thereof is lower. It is, therefore, unavoidable to introduce such a technique for meeting the prevailing requirement of the processing performance. The technique of cooling the semiconductor devices, which generally includes natural air cooling, forced air cooling and liquid cooling, is the one for preventing the thermal breakdown due to the heat generated in the semiconductor itself. Immersion cooling, on the other hand, which is used for cooling the Josephson device or the like, is realized as a cooling method for maintaining the operating temperature of the device, but the application of this technique to computers in general is difficult due to the maintenance problem.

SUMMARY OF THE INVENTION

The object of the present invention is to provide a practical cooling structure, taking maintainability into consideration, in which a semiconductor circuit is cooled to its operating temperature adapted for operation at a high clock frequency.

An electronic apparatus according to this invention comprises a motherboard, multi-chip modules mounted to the motherboard, cooling members for cooling the multi-chip modules, a refrigeration unit for cooling the cooling members to the room temperature or lower, and a connection structure provided for each multi-chip module for thermally and mechanically releasibly coupling each multi-chip module to the refrigeration unit.

The cooling members can be mounted and dismounted while the multi-chip modules are being mounted to the motherboard. As a result, the motherboard can be easily separated from the cooling members, and thereby a cooling structure is realized which secures a sufficient maintainability. Also, in the case where the number of multi-chip modules is increased or decreased depending on the system configuration, the cooling members can be selectively arranged easily for a highly practicable configuration.

The following features can be added to the configuration described above.

The cooling member is fixed to the heat radiating member mounted to the multi-chip module by a fixing member (a screw, for example). Therefore, the electronic element can be cooled positively with the cooling member in close contact with the heat radiating member. By releasing the fixing member (a screw, for example), the cooling member and the multi-chip module can be mechanically separated without considering the troublesome leakage of the cooling water which may otherwise occur in the liquid cooling.

The cooling members are collectively and floatingly supported by a cooling member holding mechanism. In the case where the cooling member is fixed to the heat radiating member by a fixing member (a screw, for example), therefore, the displacement between the cooling member and the heat radiating member is guaranteed. Also, when a plurality of the cooling members are moved away from and toward the heat radiating member, the job can be accomplished in a single operation of moving the cooling member holding mechanism. The maintenance work, therefore, can be done simply by operating the cooling member holding mechanism, thus realizing a cooling mechanism very high in maintainability for the motherboard and the multi-chip module.

The cooling member has a refrigerant inlet, a refrigerant outlet, and a refrigerant path extending between the refrigerant inlet and the refrigerant outlet to circulate the refrigerant at lower than the room temperature. The multi-chip module can thus be cooled efficiently.

The cooling member holding mechanism, together with a plurality of the cooling members, can be moved toward or away from the motherboard. In this case, the cooling member holding mechanism is wholly movable along a slide mechanism. In the maintenance work to be performed on the multi-chip module, therefore, the electronic element mounted on the motherboard is exposed by pulling out the cooling member holding mechanism along the slide mechanism and rotating it like a door.

The cooling member holding mechanism includes a movable portion formed to move, together with each cooling member, toward or away from the motherboard. When the maintenance work is performed on a single multi-chip module, for example, the particular multi-chip module can be exposed by opening only one movable portion of the cooling member holding mechanism.

The multi-chip module is mounted on the motherboard by a connector, and the movable portion of the cooling member holding mechanism is configured to operate in coordination with the connector removing means. By doing so, at the time of maintenance work on a single multi-chip module, the particular multi-chip module can be released from the motherboard by opening only one movable portion of the cooling member holding mechanism.

The multi-chip module is a common board on which a multiplicity of connecting pins for connecting the motherboard and a plurality of semiconductor chips are mounted. A cooling member is mounted on the other side of the board to provide the cooling performance. This multi-chip module is formed for each set of arithmetic operation circuits. In realizing a computer system comprising eight arithmetic operation circuits in parallel, for example, eight multi-chip modules may be mounted on the motherboard.

The connection structure includes, for example, a coupler arranged at the refrigerant inlet and the refrigerant outlet of the cooling member. In this way, the cooling member can be mounted on the multi-chip module to constitute a unit, thereby facilitating the system configuration. Also, the refrigeration unit and the multi-chip module can be separated from each other by the coupler, so that the thermal and mechanical replacement is facilitated. Further, the use of the coupler with a refrigerant stopper makes the replacement possible conveniently without removing the refrigerant from inside the cooling member. Furthermore, if the cooling member is of the same size as the multi-chip module, and if clogged with a refrigerant, it can be handled with high maintainability by making the unit of such a weight as to be capable of being carried in hand.

BRIEF DESCRIPTION OF THE DRAWINGS

The present invention will become more apparent from the following description of the preferred embodiments, with reference to the accompanying drawings, in which.

DESCRIPTION OF THE PREFERRED EMBODIMENTS

Embodiments of the present invention will be explained below with reference to the drawings.

Figure 1:
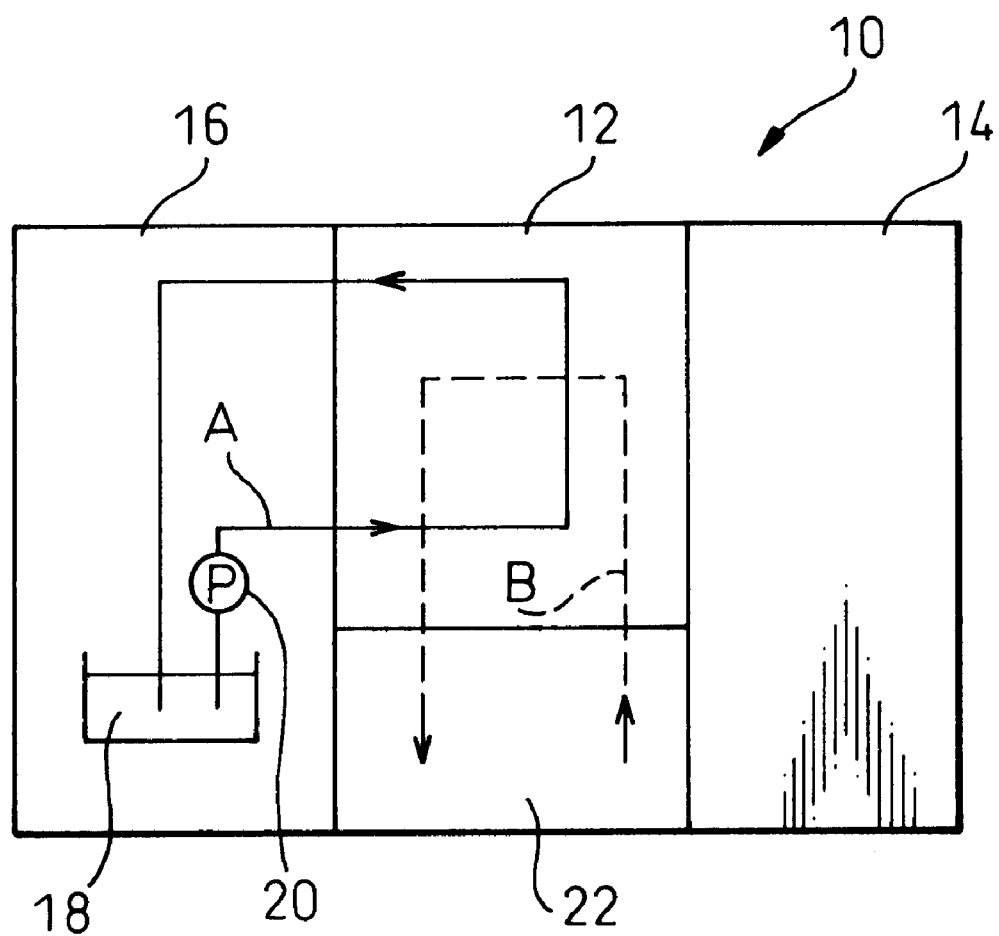
FIG. 1 is a view showing a computer system according to the embodiment of the present invention.

FIG. 1 shows a computer system 10 according to the embodiment of the invention. The computer system 10 includes an electronic apparatus 12 having a plurality of multi-chip modules making up the essential parts of the system, such as a CPU, and another peripheral unit 14. The multi-chip modules of the electronic apparatus 12 making up the essential part of the system require cooling for high-speed operation. Therefore, a refrigeration unit 16 is arranged in a position adjacent to the electronic apparatus 12.

The refrigeration unit 16 includes a compressor, a condenser and an evaporator (not shown), to decrease the temperature in the refrigeration unit 16 to room temperature or lower. The refrigeration unit 16 has arranged therein a tank 18 and a pump 20. The refrigerant (water) cooled in the refrigeration unit 16 to room temperature or lower is sent to the electronic apparatus 12 by the pump 20 from the tank 18, as shown by the arrow A. The refrigerant that has left the electronic apparatus 12 is returned to, and recooled by, the refrigeration unit 16.

A drying unit 22 is arranged under the electronic apparatus 12. The drying unit 22 includes drying or dehumidifying means, such as silica gel. Dry air is sent from the drying unit 22 to the electronic apparatus 12 as shown by the dashed arrow B. The drying air that has left the electronic apparatus 12 is returned to and dried again by the drying unit 22. In this way, by sending the dry air to the electronic apparatus 12, the strongly-cooled interior of the electronic apparatus 12 is protected from dewing.

Figure 2:
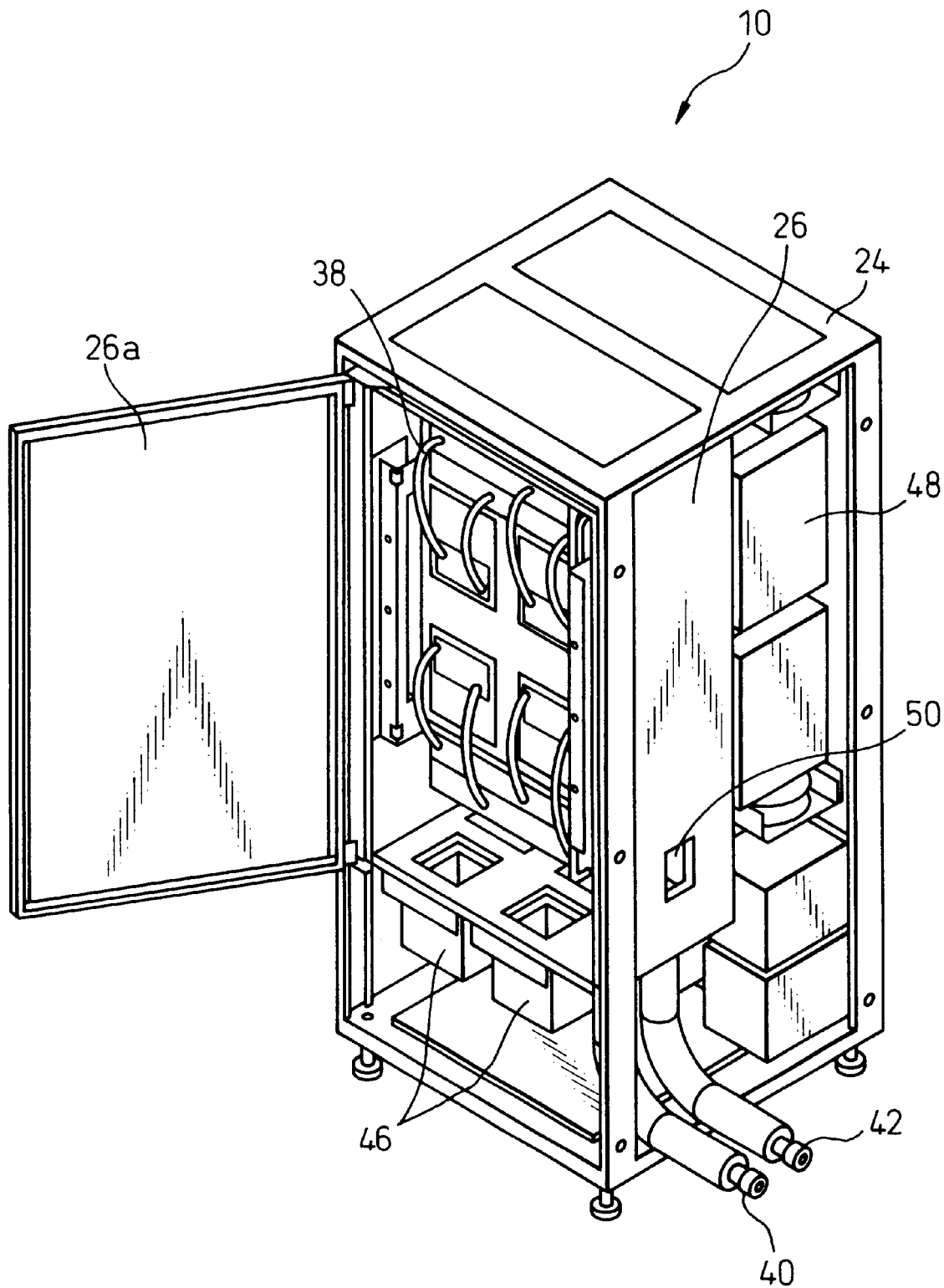
FIG. 2 is a perspective view showing an electronic apparatus according to an embodiment of the invention.
Figure 3:
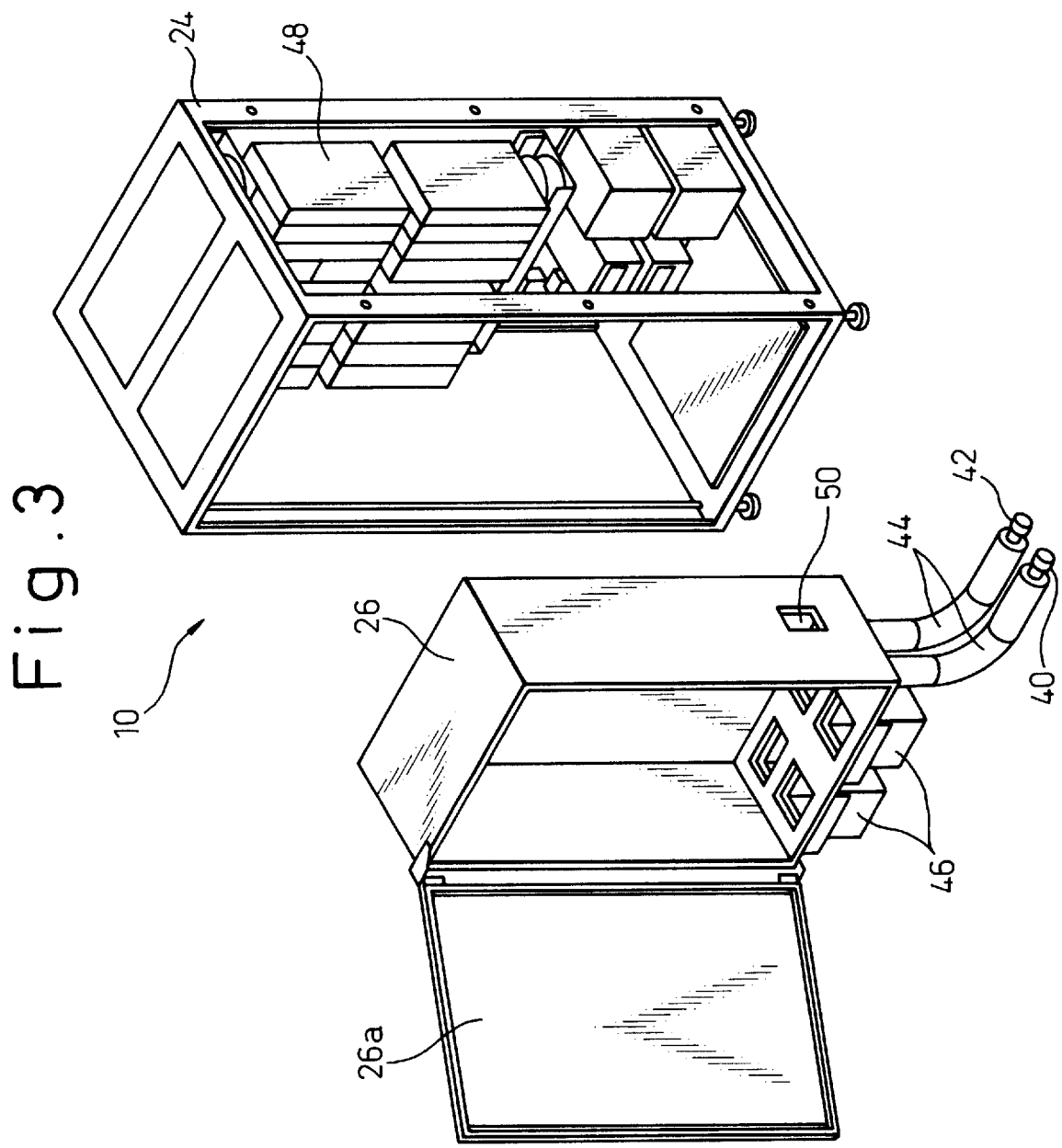
FIG. 3 is an exploded perspective view of a part of the electronic apparatus shown in FIG. 2.
Figure 4:
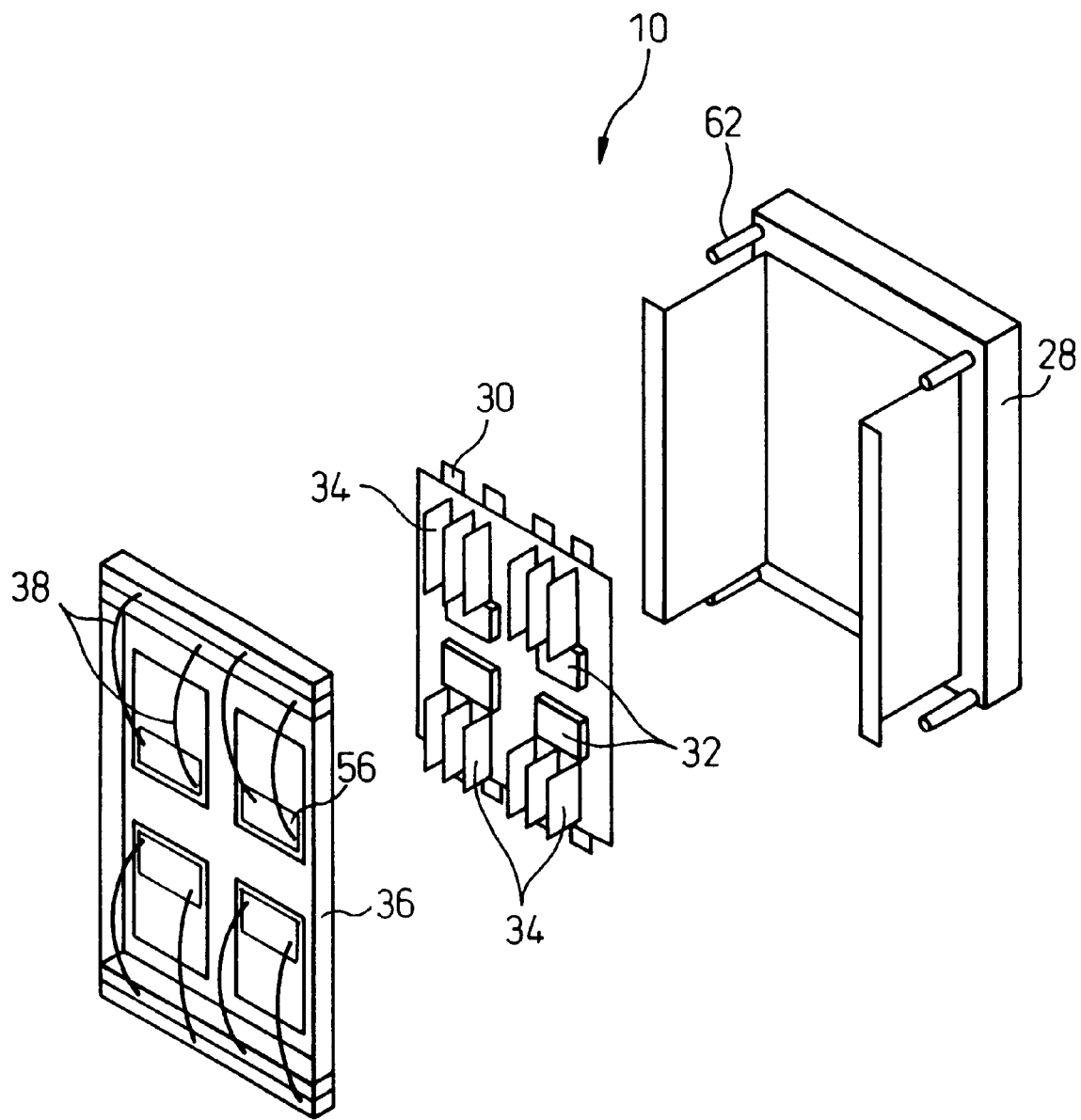
FIG. 4 is an exploded perspective view of the remaining part of the electronic apparatus shown in FIG. 2.

FIG. 2 is a perspective view showing the electronic apparatus 12 of FIG. 1. FIG. 3 is a view showing a part of the electronic apparatus 12 of FIG. 2, and FIG. 4 is a view showing the remaining part of the electronic apparatus 12. In FIGS. 2 to 4, the electronic apparatus 12 includes a casing 24. The casing 24 is shown with its side wall removed. A box structure 26 is arranged in the casing 24, and a frame 28 is arranged in the box structure 26. The box structure 26 has a door 26a.

A motherboard 30 is mounted to the frame 28. A plurality of first electronic elements 32 and a plurality of second electronic element groups 34 are mounted to the motherboard 30. Further, a cooling member holding mechanism 36 collectively holds plate-like cooling members (56 of FIG. 6) for cooling the first electronic elements 32. The cooling members 56 are arranged in a facing relationship with the multi-chip modules (first electronic elements) 32. The cooling member holding mechanism 36 has hoses 38 connected to the cooling members 56. Also, the cooling member holding mechanism 36 holds the cooling members (114 in FIG. 29) of the second electronic element groups 34, described later.

Figure 29:
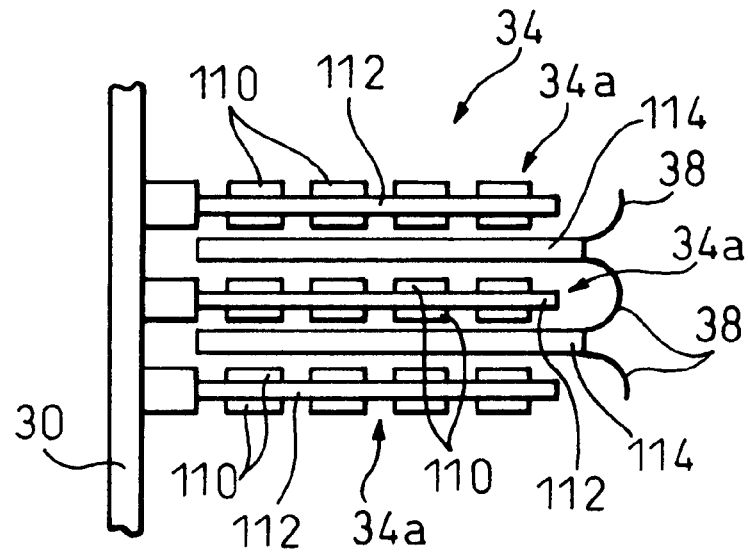
FIG. 29 is a view showing an example of cooling the second electronic elements.

Hoses 40 and 42 extending from the refrigeration unit 16 and constituting a part of the refrigerant supply means are mounted to the under side of the box structure 26. The hoses 40 and 42 are surrounded by insulating members 44. Hoses 38 are connected to the hoses 40 and 42 through manifolds described later. Further, ducts 46 extending from the drying unit 22 are mounted to the under side of the box structure 26., The first electronic elements 32 each comprises a chip module including a plurality of semiconductor chips (CMOS) mounted to a common board. This chip module is called a multi-chip module (MCM) and makes up the essential part of the system. The second electronic element group 34 comprises a plurality of second electronic elements 34a (FIG. 29). The second electronic elements 34a comprises semiconductor chips for RAM, for example, mounted to a printed board. The first electronic elements 32 and the second electronic element groups 34 are mounted to the same motherboard 30.

The casing 24 includes a power unit 48. When the frame 28 is arranged in the box structure 26 and the box structure 26 is arranged in the casing 24, the power unit 48 is connected to the motherboard 30 by a cord (not shown), so that power is supplied to the first electronic elements 32 and the second electronic element groups 34 through the motherboard 30. A hole 50 through which the power cord is passed is shown in the box structure 26 of FIG. 3. The power cord is passed through the hole 50 and connected to the motherboard 30, after which the hole 50 is hermetically sealed.

Figure 5:
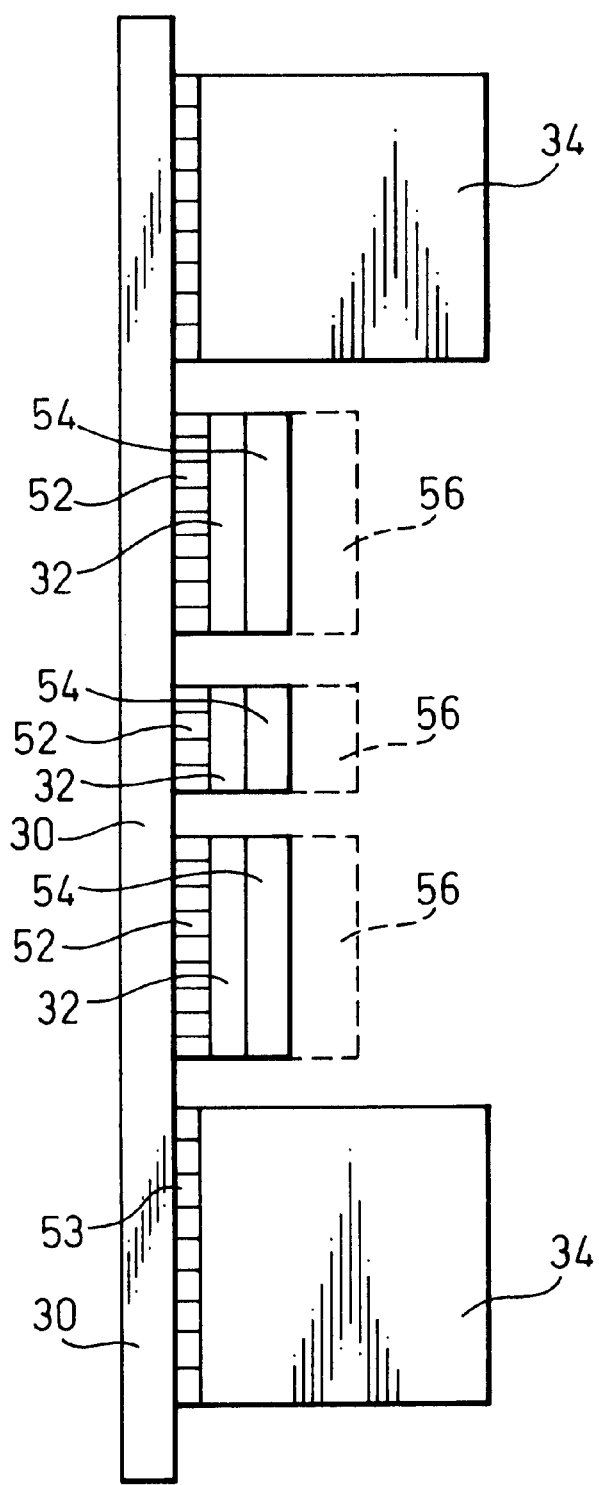
FIG. 5 is a view showing the electronic elements mounted to the motherboard.

FIG. 5 shows the first electronic elements 32 and the second electronic element groups 34 mounted to the motherboard 30. A connection structure includes connectors 52 in the form of connector pins mounted to the motherboard 30, and the first electronic elements 32 are adapted to be plugged into the connectors 52. Heat radiating plates 54, called heat sinks, are fixed to the first electronic elements 32. The plate-like cooling members 56 are brought into contact with the heat radiating plates 54 to thereby cool the first electronic elements 32. The cooling members 56 are held by the cooling member holding mechanism 36, and a refrigerant is supplied therethrough. Also, the connection structure includes connectors 53 for the second electronic elements 34a of the second electronic element groups 34 are mounted to the motherboard 30.

Figure 6:
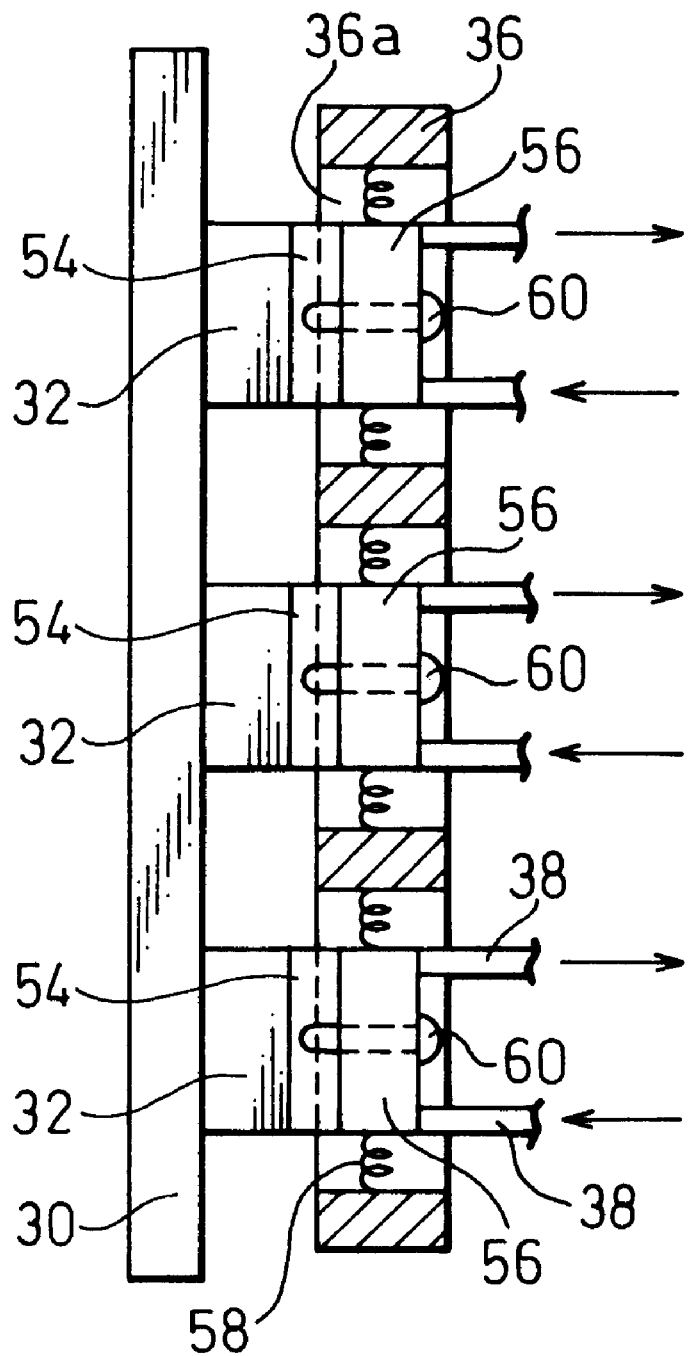
FIG. 6 is a cross-sectional view showing the cooling member holding mechanism holding the cooling members.
Figure 7:
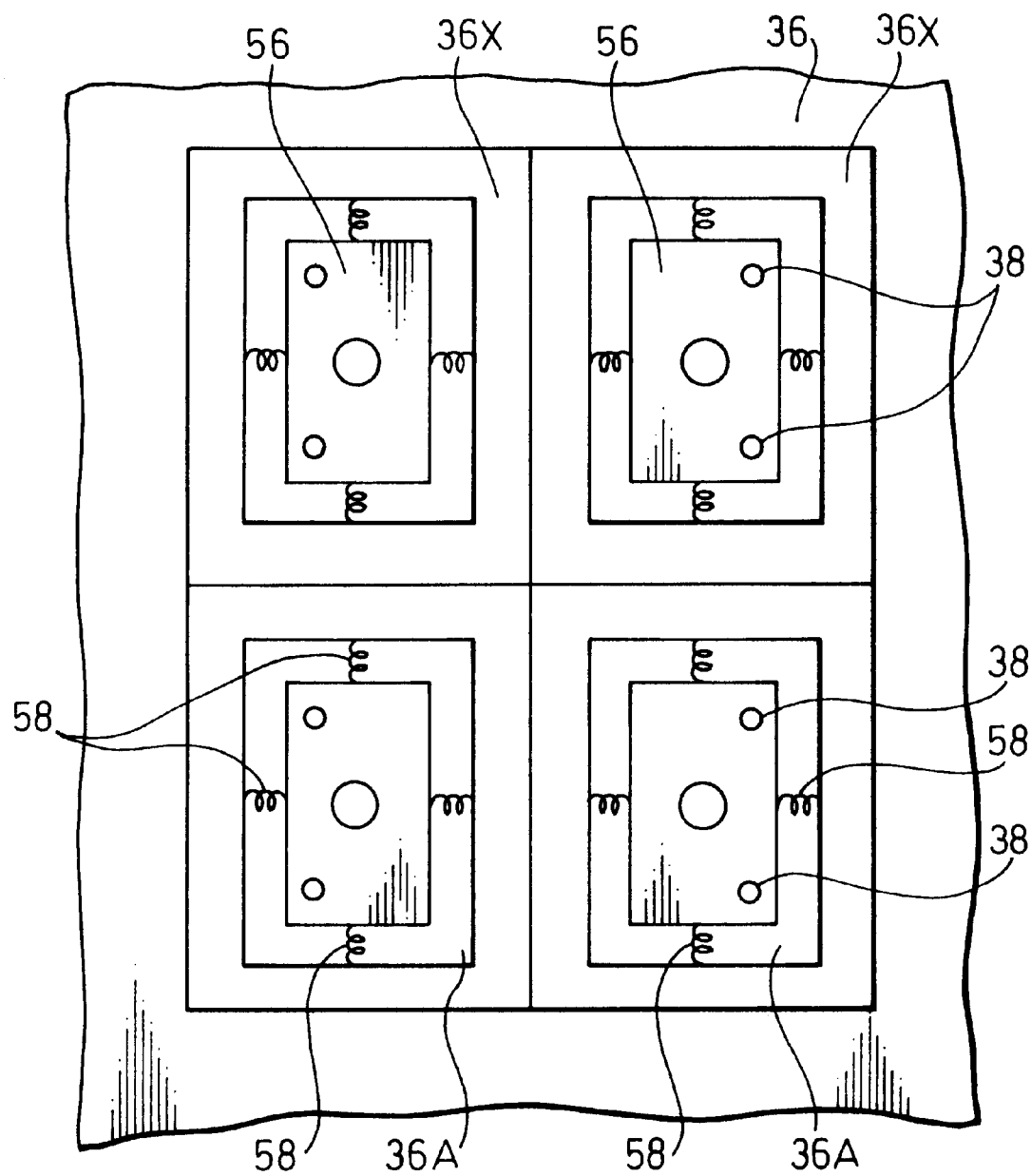
FIG. 7 is a front view of the cooling member holding mechanism.

FIG. 6 is a cross-sectional view showing the cooling member holding mechanism 36 for holding the cooling members 56, and FIG. 7 is a front view of a part of the cooling member holding mechanism 36. The cooling member holding mechanism 36 is a tabular member having a size approximately identical to that of the motherboard 30, and has openings 36A slightly larger than the cooling members 56 at positions where the cooling members 56 are to be held (the positions opposed to the first electronic elements 32). The cooling members 56 are arranged in the openings 36a and supported on the side wall of the opening 36a by springs 58. In other words, the cooling members 56 are floatably held by the cooling member holding mechanism 36 and absorb the positional error between the motherboard 30 and the frame 28.

The cooling member holding mechanism 36 is formed such that the cooling members 56 are brought into contact with the heat radiating plates 54. Hoses 38 are connected to the cooling members 56, and the refrigerant is passed through the refrigerant paths in the cooling members 56. Preferably, each cooling member 56 is fixed to the heat radiating plate 54 by a fixing member such as screw 60. Consequently, the cooling member 56 closely contacts the heat radiating plate 54 to thereby effectively cool the first electronic elements 32 through the heat radiating plates 54.

Figure 8:
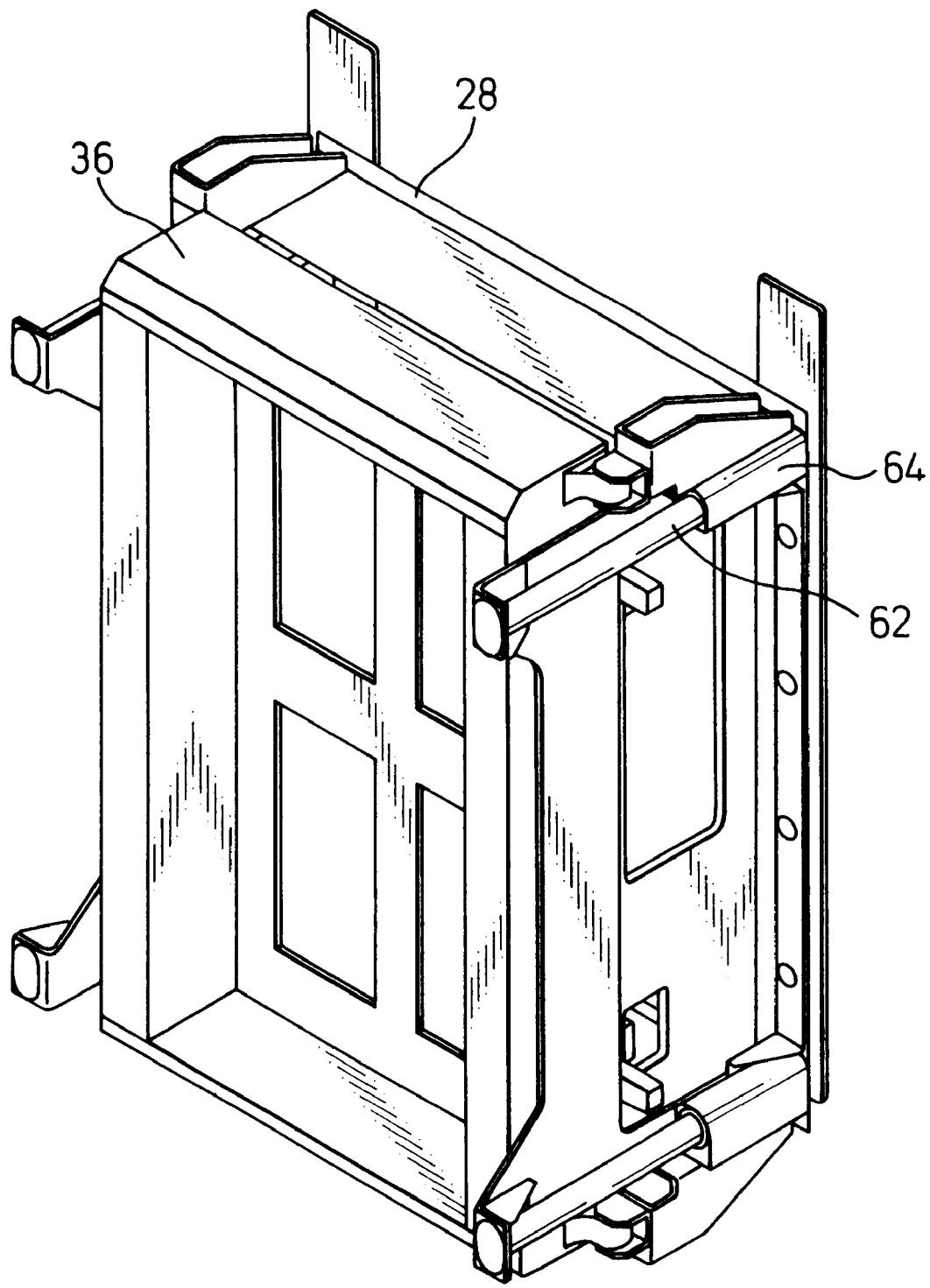
FIG. 8 is a view showing the moving mechanism for the cooling member holding mechanism.
Figure 9:
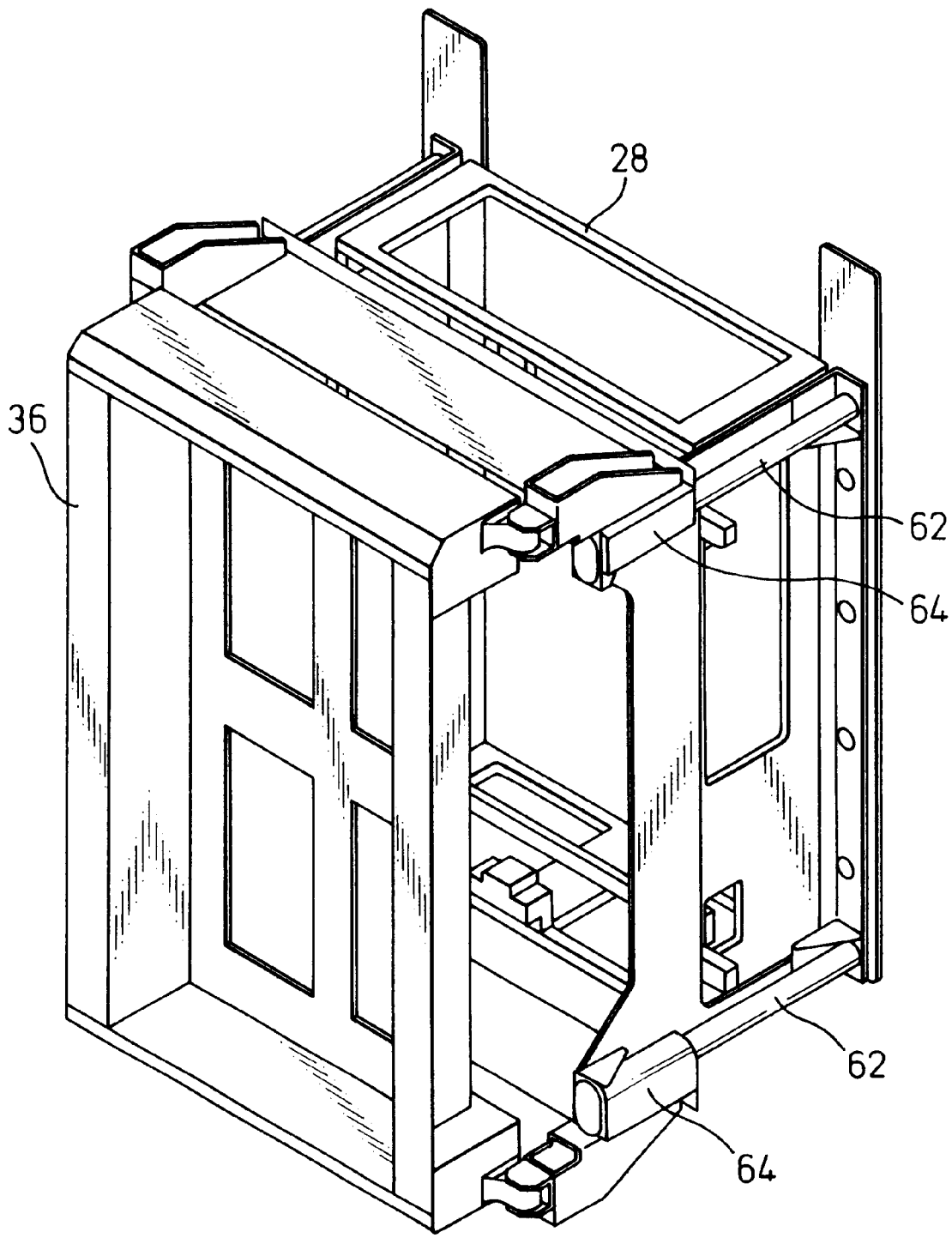
FIG. 9 is a view showing the cooling member holding mechanism in the outwardly slid position.
Figure 10:
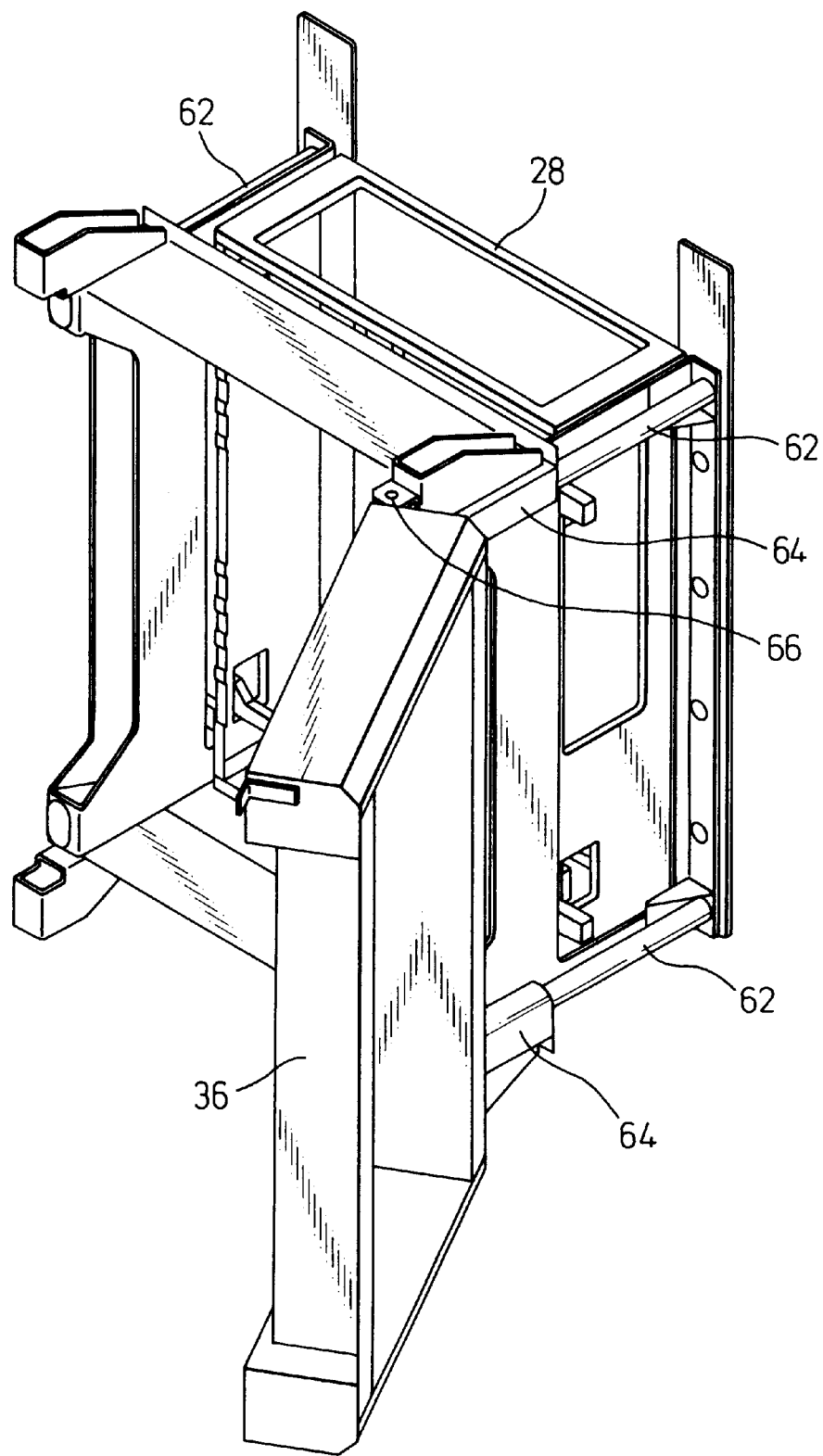
FIG. 10 is a view showing the cooling member holding mechanism in the rotated position after being slid.
Figure 11:
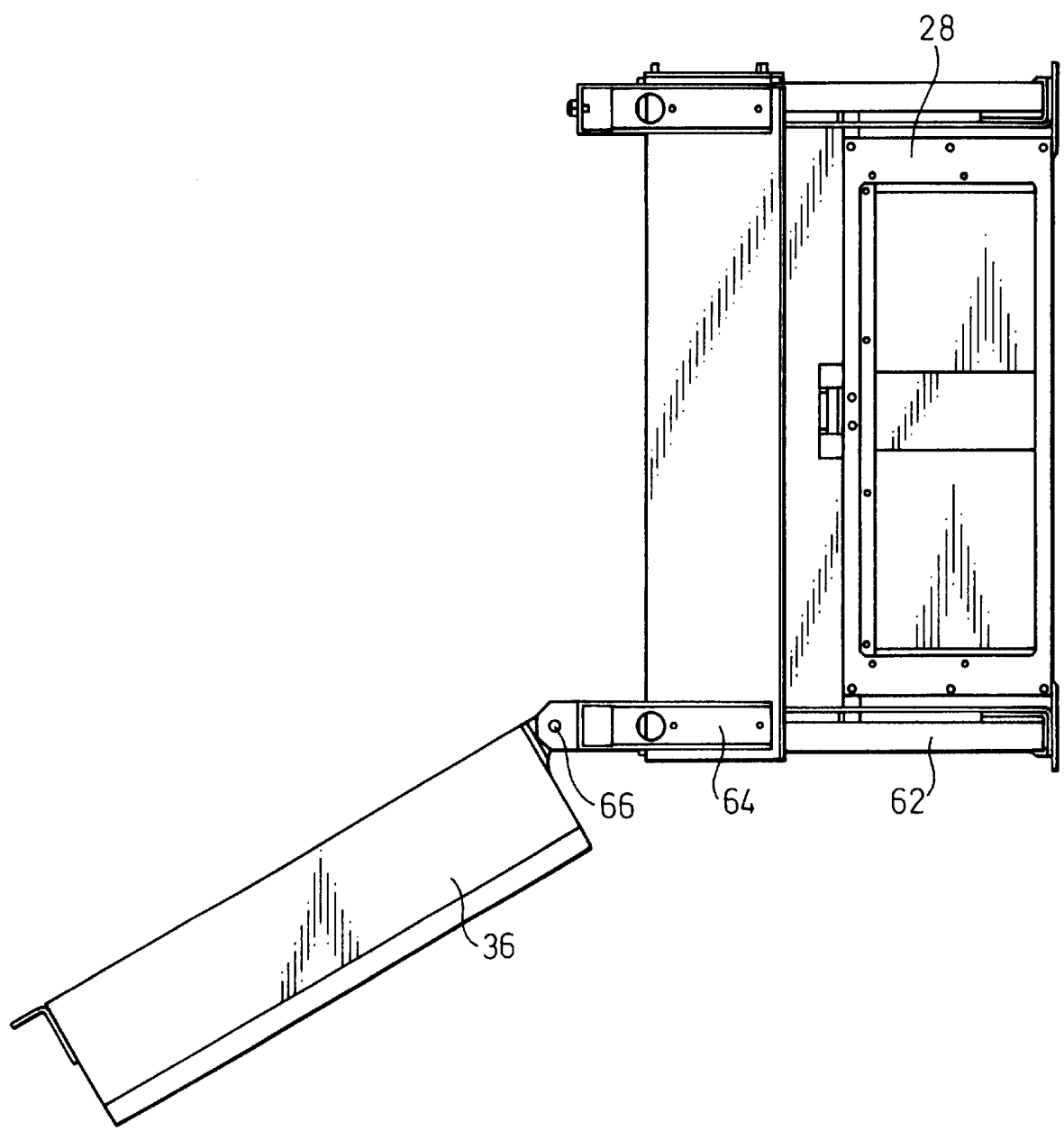
FIG. 11 is a plan view showing the cooling member holding mechanism of FIG. 10.

FIG. 8 shows a moving mechanism for the cooling member holding mechanism 36. FIG. 9 shows the cooling member holding mechanism 36 in outwardly slid position, and FIG. 10 is a view showing the cooling member holding mechanism 36 in a rotated position after sliding. FIG. 11 is top view showing the cooling member holding mechanism 36 of FIG. 10.

As shown in FIGS. 4, 8, 9 and 10, the frame 28 arranged in the box structure 26 has a slide guide 62 on both sides thereof, and the cooling member holding mechanism 36 has slide portions 64 slidable along the slide guides 62. Therefore, the cooling member holding mechanism 36 is movable toward and away from the motherboard 30 together with the cooling plate members 56.

The cooling member holding mechanism 36 at a position near the motherboard 30 is shown in FIG. 8, and the cooling member holding mechanism 36 at a position far from the motherboard 30 is shown in FIG. 9. Further, the cooling member holding mechanism 36 is wholly rotatable, like a door, around a supporting point 66 arranged on the slide portion 64. As a result, as shown in FIGS. 10 and 11, the cooling members 56 and the cooling member holding mechanism 36, after being pulled out, rotate collectively, like a door, around the supporting point 66 of the cooling member holding mechanism 36. This facilitates the maintenance and replacement of the essential parts of the system as a whole.

Figure 12:
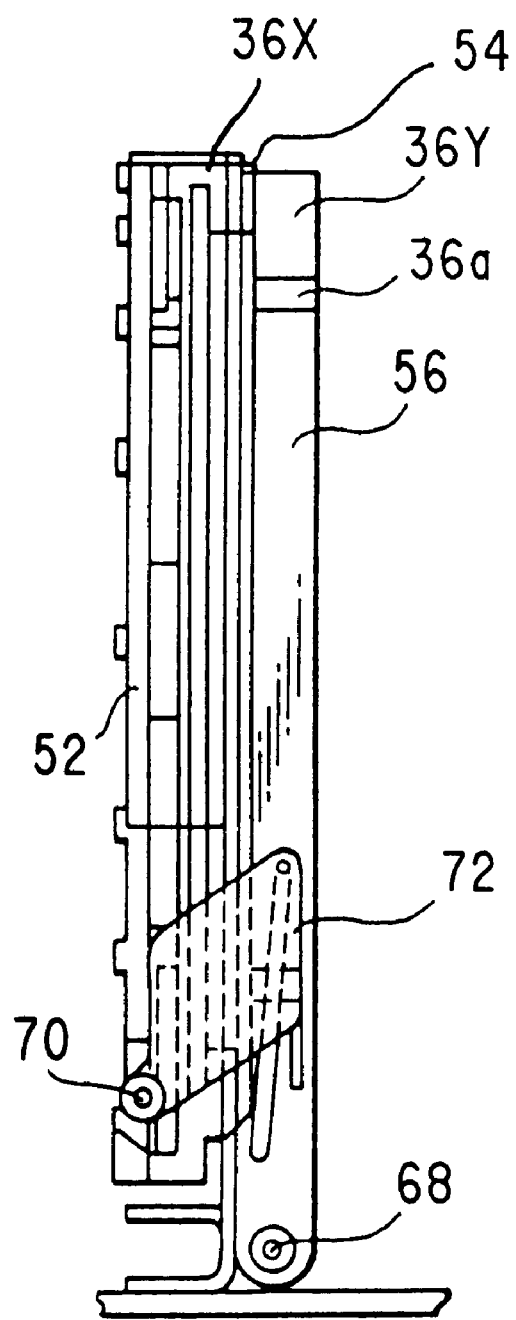
FIG. 12 is a view showing a configuration in which the cooling member holding mechanism is partially moved.
Figure 13:
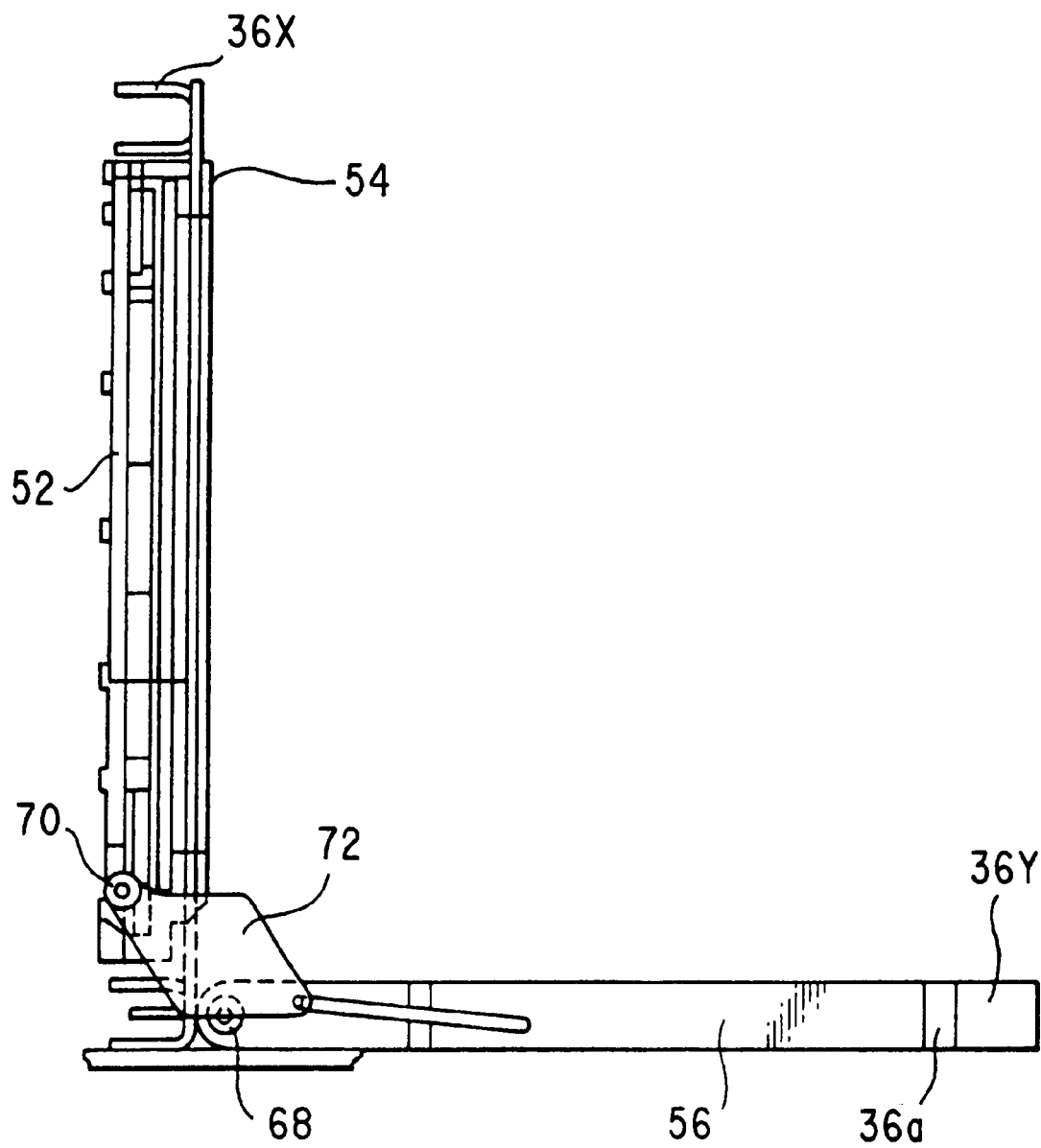
FIG. 13 is a view showing the movable portion of FIG. 12 in open state.

FIGS. 8 to 11 show a configuration in which the whole cooling member holding mechanism 36 moves, while FIGS. 12 and 13 show a configuration in which the cooling member holding mechanism 36 moves partially. As shown in FIG. 7, the cooling member holding mechanism 36 has defined areas 36X slightly larger than the area of the opening 36a in which cooling members 56 are arranged. FIGS. 12 and 13 also show the defined area 36X of the cooling member holding mechanism 36.

The cooling member holding mechanism 36 includes a movable portion 36Y formed to move toward and away from the motherboard 30 together with each cooling plate member 56. The movable portion 36Y is arranged to move about a supporting point 68 arranged in the defined area 36X of the cooling member holding mechanism 36, and is movable between the position where the cooling member 56 is in contact with the heat radiating plate 54, as shown in FIG. 12, and the position where the cooling member 56 is apart from the heat radiating plate 54, as shown in FIG. 13. Thus, by opening the movable portion 36Y, the maintenance and replacement work on the first electronic element 32, which otherwise poses a problem, can be accomplished. The movable portion 36Y is also arranged at the position of the second electronic element group 34.

Further, in FIGS. 12 and 13, the connector 52 for mounting the first electronic element 32 to the motherboard 30 is shown. The connector 52 mounted to the motherboard 30 is attached to a cam 70. The movable portion 36Y of the cooling member holding mechanism 36 is coupled to the cam 70 by a link 72, so that when the movable portion 36Y is moved, the cam 70 rotates to thereby mount or demount the package for the connector 52. When the movable portion 36Y of the cooling member holding mechanism 36 opens, therefore, the first electronic elements 32 can be removed from the connector 52.

According to this invention, the refrigerant temperature is not higher than room temperature. The refrigerant is supplied by refrigerant supply means to the cooling members 56 through the hoses 38, 40 and 42. Therefore, the first electronic elements 32 can be effectively cooled and operate at a high speed. By supplying the refrigerant having a temperature not higher than room temperature to the cooling members 56, the system performance is improved at a low cost. Preferably, the refrigerant supply means supplies water having a temperature not lower than 3° C. but not higher than 10° C. to the cooling members 56. More preferably, the refrigerant supply means supplies water containing an antifreeze liquid at a temperature not higher than 3° C. to the cooling member 56.

Figure 14:
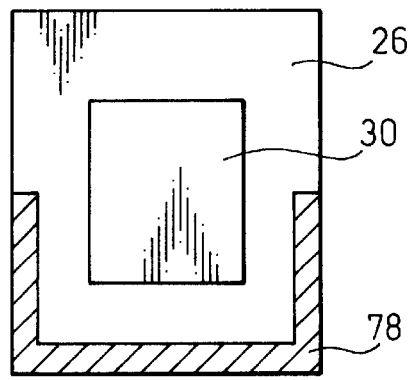
FIG. 14 is a view showing an example in which the box structure is a hermetically closed structure.
Figure 15:
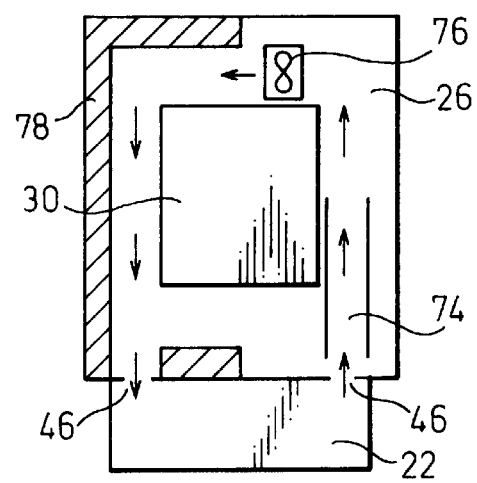
FIG. 15 is a view showing another example in which the box structure is a hermetically closed structure.
Figure 16:
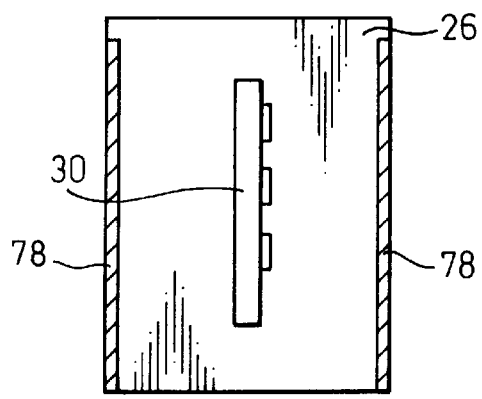
FIG. 16 is a view showing still another example in which the box structure is a hermetically closed structure.

Further, as shown in FIGS. 14 to 16, the box structure 26 is formed as a substantially hermetically sealed container. Preferably, the box structure 26 is hermetically sealed with the water penetration rate not more than 1 gram per day (1 g/day) in an environment of 30° C., 70% RH and not higher than 2° C. in wet-bulb temperature.

The motherboard 30, the electronic elements 32 and 34a, the heat radiating plates 54, the cooling members 56 and the cooling member holding mechanism 36 are housed in the box structure 26. In FIGS. 14 to 16, only the motherboard 30 is shown as representative. By making the box structure 26 hermetically sealed and circulating dry air, the dew point of the neighborhood of the electronic elements 32 and 34a in the box structure 26 is kept at a temperature not higher than the refrigerant supply temperature so that the electronic elements 32 and 34a are not affected by dewing.

Further, the drying unit 22 removes moisture in the box structure 26 by supplying the dry air into the box structure 26 through the duct 46. As shown in FIG. 15, the box structure 26 preferably includes a partitioning wall 74 for separating the air flow supplied from the drying unit 22 from the air flow returning to the drying unit 22. Also, at least one of the duct 46 and a fan 76 is provided in the box structure 26 to ensure smooth circulation of the dry air supplied from the drying unit 22 in the box structure 26. In this way, moisture is removed from the interior of the box structure 26 to prevent the electronic elements 32 and 34a from being affected by moisture.

Furthermore, the wall of the box structure 26 has a portion with a thermal insulating layer and a portion without an insulating layer. The wall with an insulating layer can maintain the interior of the box structure 26 at a low temperature. In the case where the atmospheric temperature outside of the box structure 26 is higher than the internal air temperature of the box structure 26, however, the outer surface of the box structure may be dewed. In the case where the atmospheric temperature outside of the box structure 26 is lower than the internal temperature of the box structure 26, on the other hand, the interior of the box structure 26 may be overheated. In order to prevent these inconveniences, the wall of the box structure 26 is sometimes preferably partially provided with an insulating layer.

In FIG. 14, the insulating layer 78 is provided only at the under side of the box structure 26. This corresponds to the fact that the portion at the under side of the box structure 26 is liable to decrease in temperature. In FIG. 15, the insulating layer 78 is formed only at the downstream portion of the dry air circulating from the drying unit 22. This corresponds to the fact that the portion at the downstream portion of the drying air in circulation is liable to decrease in temperature. Also, by positively agitating the internal air, the internal environment of the box structure can be made uniform and the humidity in the narrow gap which tends to remain humid at the time of start of the drying unit can be sharply reduced within a short time. In FIG. 16, the radiation insulating layer 78 is formed only on the inner surface of the box structure opposed to the surface of the electronic elements 32 and 34a and both sides of the motherboard 30. This corresponds to the fact that the temperature of the inner surface of the box structure opposed to the cold surface is liable to decrease due to heat exchange by the radiator.

Figure 17A:
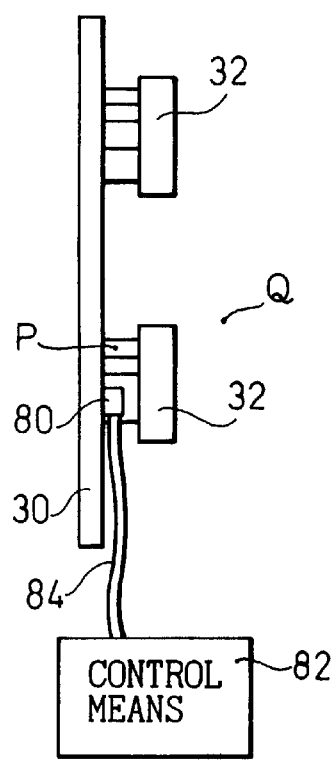
FIG. 17A is a view showing an example in which a heating element is arranged in the narrow space between the motherboard and the electronic elements.

FIG. 17A shows an example in which a heating element 80 is inserted in a narrow space between the motherboard 30 and the first electronic element 32. The heating element 80 is energized by control means 82 through a lead wire 84.

Figure 17B:
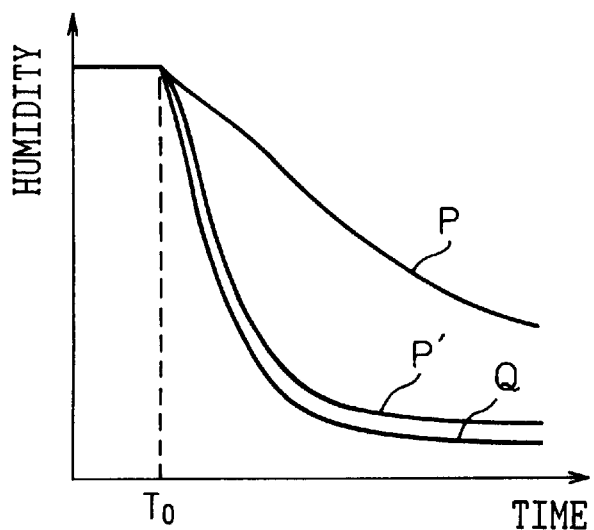
FIG. 17B is a graph showing the humidity change in the box structure from the start of the operation of the drying unit.

FIG. 17B shows a humidity change in the box structure 26 from the start of the operation of the drying unit 22. The curve P indicates the humidity change in the narrow space between the motherboard 30 and the first electronic element 32 (the position P in FIG. 17A, for example), and the curve Q indicates the humidity change in the broad space around the first electronic element 32 (the position Q in FIG. 17A, for example). As the drying unit 22 starts operation, the large air flow reduces the humidity with comparative rapidity in the broad space around the first electronic element 32. In the curve P, however, the air flow is so small in the narrow space between the motherboard 30 and the first electronic element 32 that the humidity decreases more slowly. Thus, the first electronic element 32, when cooled, may receive dew on the surface thereof.

In view of this, the heating element 80 of FIG. 17A is supplied with power within an initial predetermined time of operation of the drying unit 22, whereby the moisture existing in the narrow space between the motherboard 30 and the first electronic elements 32 is evaporated while at the same time generating an ascending air current, so that the humidity of the narrow space between the motherboard 30 and the first electronic elements 32 is rendered to approach the humidity of the broad space around the first electronic elements 32 as the curve P' of FIG. 17B. In this case, however, the provision of the heating element 80 is not always required but the first electronic element 32 may be used as the heating element 80.

Figure 18:
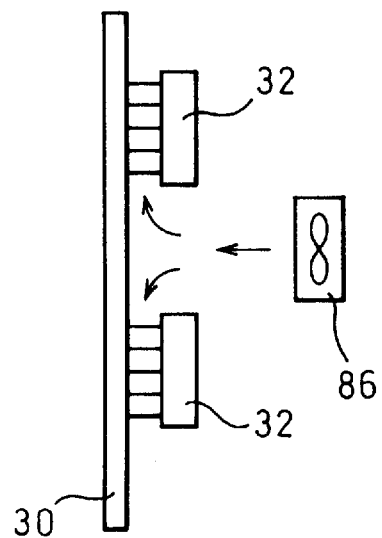
FIG. 18 is a view showing an example in which blowers move the air in the narrow space between the mother board and the electronic elements.
Figure 19:
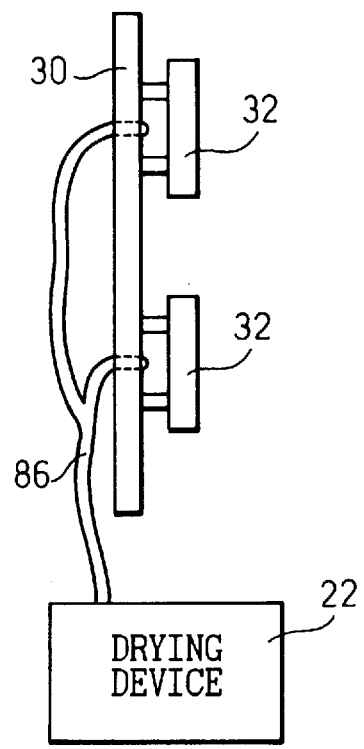
FIG. 19 is a view showing an example in which air introduction means for introducing dry air is arranged in the narrow space between the motherboard and the first electronic elements.

FIGS. 18 and 19 show examples in which air introduction means 86 is provided for introducing dry air into the narrow space between the motherboard 30 and the first electronic elements 32. In FIG. 18, the air introduction means 86 is a fan which is opposed to the first electronic elements 32 on the motherboard 30, and blows the air at the broad space around the first electronic elements 32 into the narrow space between the motherboard 30 and the first electronic elements 32.

In FIG. 19, the air introduction means 86 is formed as a small tube, and the dry air is introduced as an air flow by the drying unit (device) 22. In these cases, too, within an initial predetermined time of operation of the drying unit 22, the humidity in the narrow space between the motherboard 30 and the first electronic elements 32 is rendered to approach the humidity in the broad space around the first electronic elements 32 as early as possible.

Figure 20:
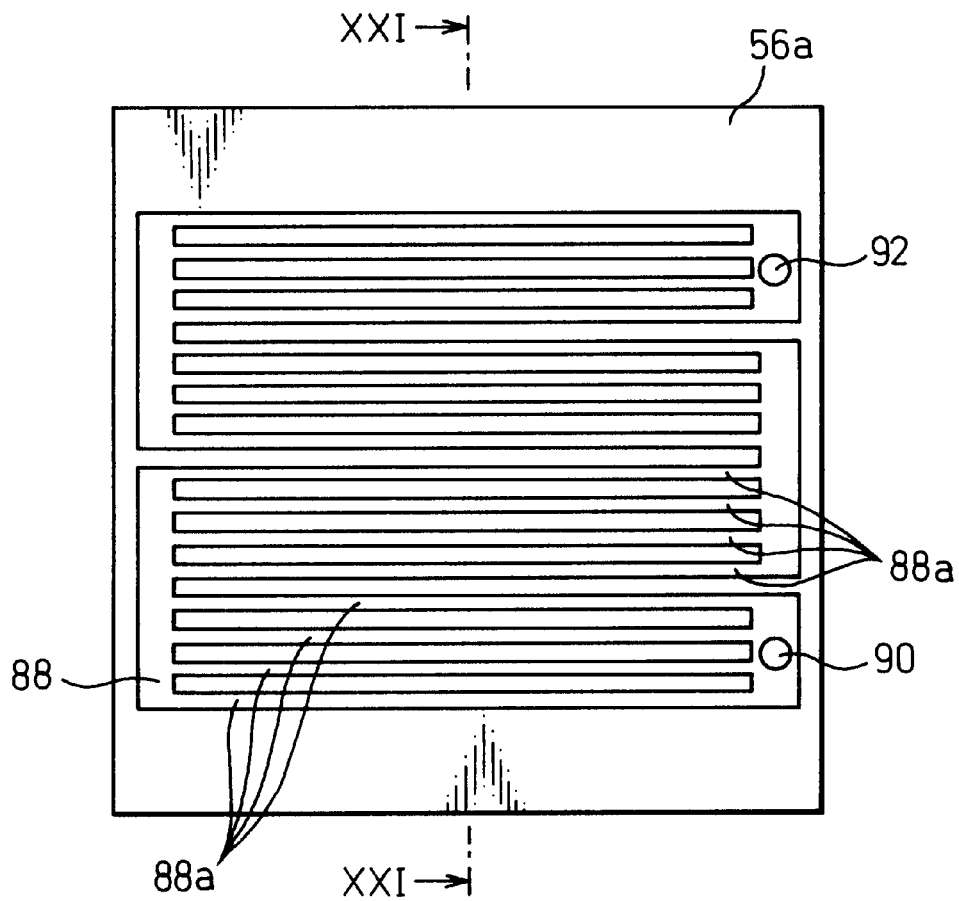
FIG. 20 is a plan view showing one plate member constituting the cooling member.
Figure 21:
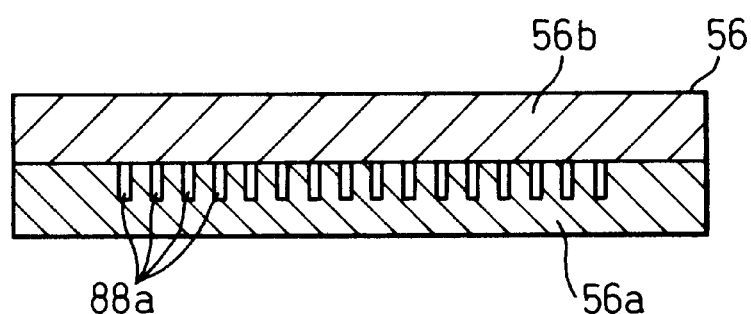
FIG. 21 is a cross-sectional view of the cooling member.

FIG. 20 is a plan view showing a plate member 56a of the cooling member 56, and FIG. 21 shows a cross-sectional view of the cooling member 56. The cooling member 56 consists of two plate members 56a and 56b laid one on the other and coupled to each other by brazing. The cooling member 56 has a refrigerant path 88, a refrigerant inlet 90 and a refrigerant outlet 92. The refrigerant path 88 is formed of a plurality of parallel passages 88a grooved on a surface of the plate member 56a.

In FIG. 20, the refrigerant path 88 is formed of four parallel passages 88a. The refrigerant path 88 of the refrigerant member 56a turns two returns on the surface of refrigerant member 56a, and the parallel passages 88a merge at each bend. Thus, the refrigerant can be distributed widely over the surface of the cooling plate 56, resulting in advantages in increasing the effective cooling area and improving the cooling efficiency.

Figure 22:
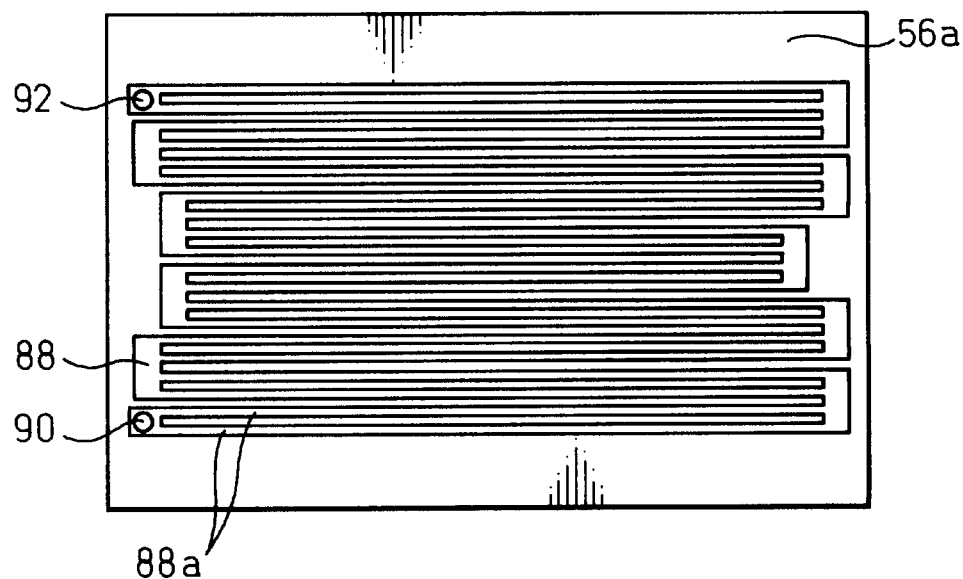
FIG. 22 is a plan view showing another example of one plate member constituting the cooling member.

FIG. 22 is a plan view showing another example of the plate member 56a constituting the cooling member 56. In this example, the refrigerant path 88 includes two parallel passages 88a, which turns five returns over the surface of the plate member 56a.

Figure 23:
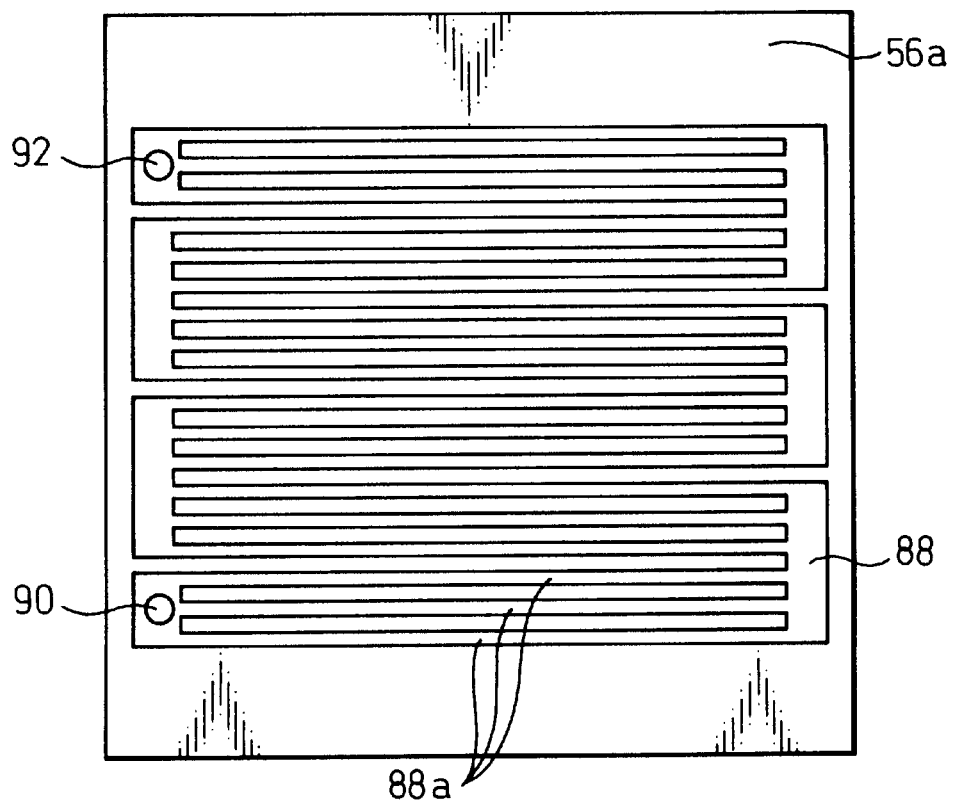
FIG. 23 is a plan view showing another example of one plate member constituting the cooling member.

FIG. 23 is a plan view showing another example of the plate member 56a constituting the cooling member 56. In this example, a refrigerant path 88 consists of three parallel passages 88a, and the three parallel passages 88a make three turns over the surface of the plate member 56a.

A pressure loss of refrigerant flow through the refrigerant path 88 of the cooling member 56 is less than 700 Pa per $cm^2$ of the heat transfer area of the cooling member 56, and a cooling performance is less than 7623° C./W per $cm^2$ of the heat transfer area of the cooling member 56.

Figure 24:
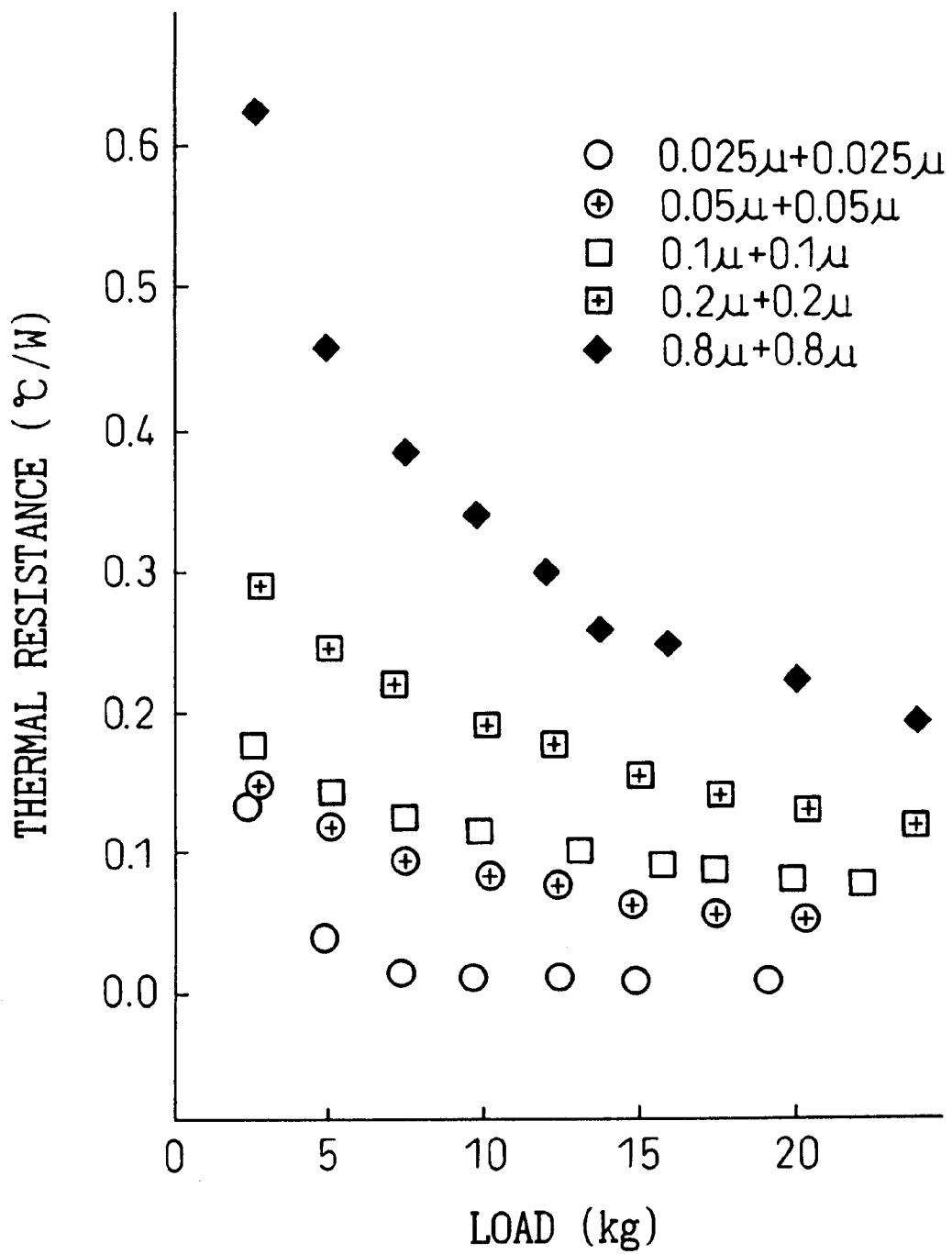
FIG. 24 is a graph showing the relationship between the load and the thermal resistance with the surface roughness of the cooling member and the radiator as parameters.

FIG. 24 is a diagram showing a relationship of the thermal contact resistance to the mechanical load, with surface roughness of the cooling member 56 and the heat transfer plate 54 varying as parameters. As seen in FIG. 24, the smoother the surface roughness, the smaller the thermal contact resistance and the higher the heat transfer from the heat transfer plate 54 to the cooling member 56. In FIG. 24, the surface contacting roughness is 0.025 $\mu$m, 0.05 $\mu$m, 0.1 $\mu$m, 0.2 $\mu$m and 0.8 $\mu$m respectively. If the surface roughness Ra of the cooling member 56 and the heat transfer plate 54 are not more than 0.2 $\mu$m in terms of the average roughness along the center line, as shown in the figure, the thermal contact resistance then can be kept in within a satisfactory level without imposing a large mechanical load.

Figure 25:
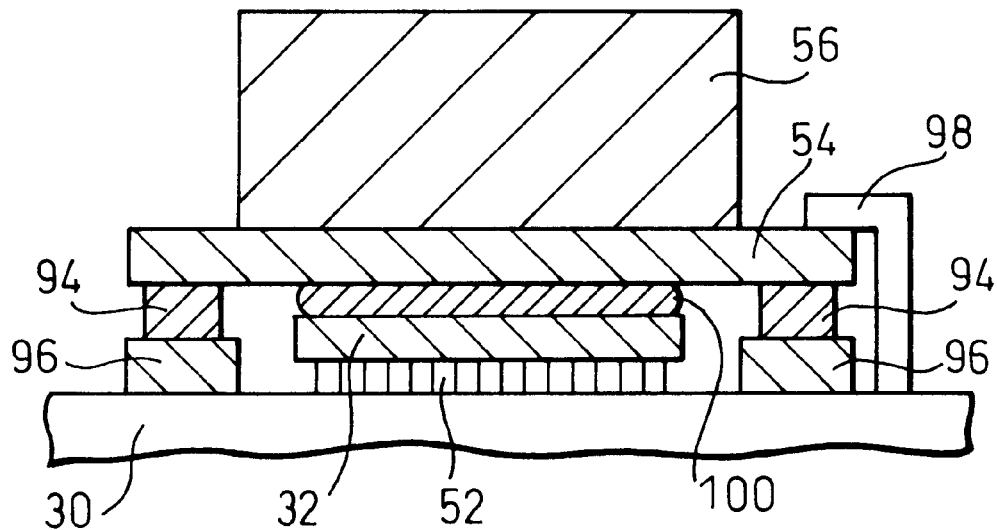
FIG. 25 is a cross-sectional view showing an example of the method of mounting the heat radiating member and the cooling member.

FIG. 25 is a cross-sectional view showing an example of mounting the heat transfer plate 54 and the cooling member 56. Spacers 94 are arranged between the motherboard 30 and the heat transfer plate 54 in such a manner as to maintain a gap between the first electronic element 32 and the heat transfer plate 54. Spacer mounting means 96 are mounted on the motherboard 30. The spacer mounting means 96 can adjust the position of the spacers 94 as to maintain a gap between the first electronic element 32 and the heat transfer plate 54. The heat transfer plate 54 is fixed by the heat transfer plate mounting means 98 at a position predetermined by the spacers 94. The cooling member 56 is attached directly to the heat transfer plate 54 as described above. In this way, the cooling member 56 collectively held by the cooling member holding mechanism 36 is positively placed in contact with the heat transfer plate 54.

A high heat conductive material 100 is filled between the first electronic element 32 and the heat transfer plate 54. The high heat conductive material 100 is a compound for filling the gap between the heat transfer surface of the first electronic element 32 and the heat-receiving surface of the heat transfer plate 54.

Figure 26:
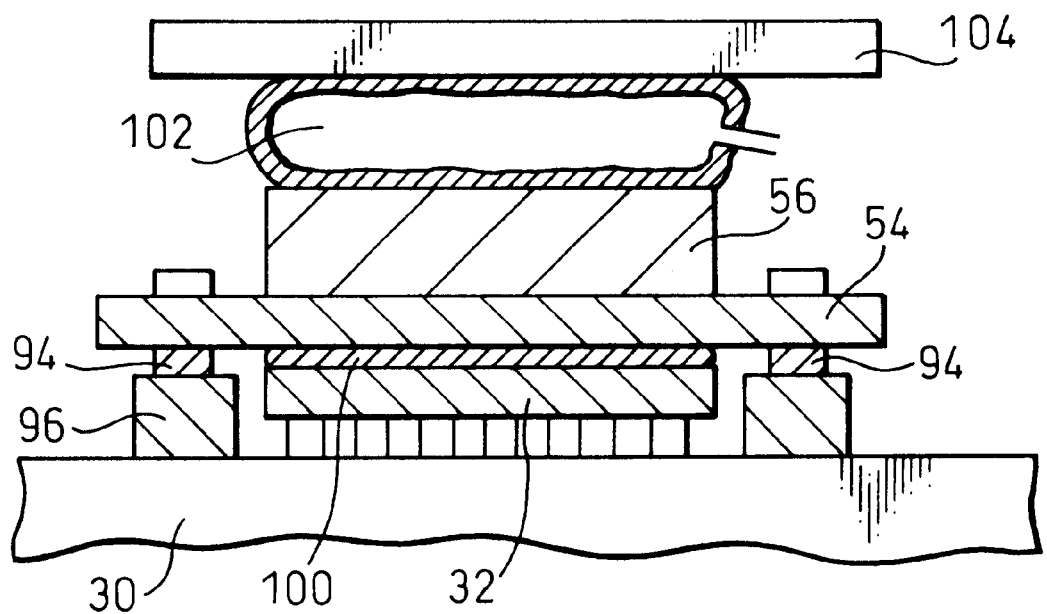
FIG. 26 is a cross-sectional view showing another example of the method of mounting the heat radiating member and the cooling member.

FIG. 26 is a cross-sectional view showing another example of mounting the heat transfer plate 54 and the cooling member 56. This example induces pressure means 102 for bringing the heat transfer plate 54 and the cooling member 56 into pressure contact with each other. As a result, the cooling member 56 is positively brought into contact with the heat transfer plate 54, and the first electronic element 32 can be effectively cooled. In this embodiment, the pressure means 102 is an expandable container. By injecting a fluid into this container, the container expands and presses the cooling member 56 against the heat transfer plate 54. The pressure means 102 is inserted between the cooling member 56 and a support wall 104.

Figure 27:
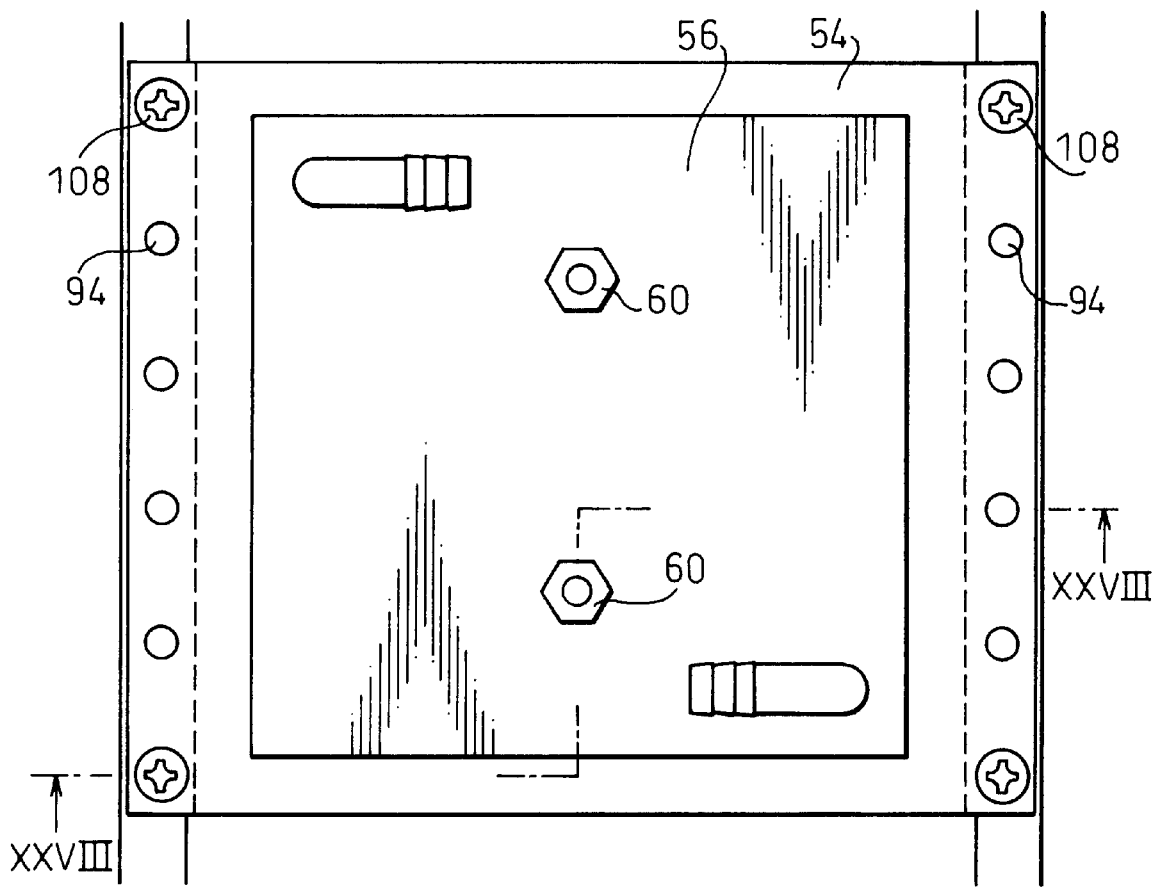
FIG. 27 is a plan view showing another example of the method of mounting the heat radiating member and the cooling member.
Figure 28:
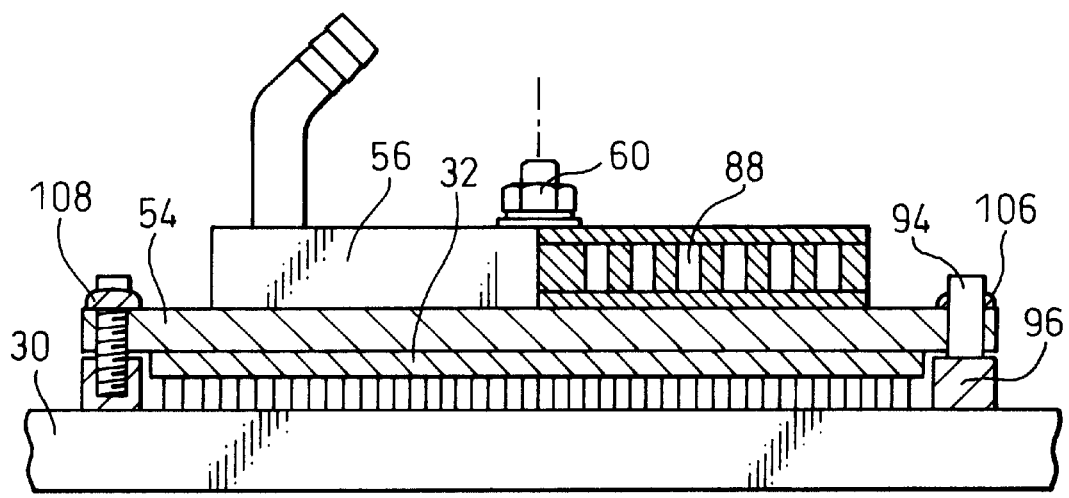
FIG. 28 is a cross-sectional view of the heat radiating member and the cooling member of FIG. 27.

FIGS. 27 and 28 are cross-sectional views showing another example of mounting the heat transfer plate 54 and the cooling member 56. In this example, the spacers 94 are movable in the direction perpendicular to the heat transfer plate 54. Specifically, the spacers 94 are formed as spacer pins inserted into the holes of the heat transfer plate 54, and the tip of the spacer 94 is adapted to be in contact with a seat 96 mounted on the motherboard 30. The tip of each spacer 94 in contact with the seat 96 on the motherboard 30 sets the spacer 94 in position relative to the heat transfer plate 54 in such a manner as to maintain a gap between the first electronic element 32 and the heat transfer plate 54. After being set in position in this way, the spacer 94 is fixed on the heat transfer plate 54 by an adhesive 106.

For a gap to be maintained between the first electronic element 32 and the heat transfer plate 54, a sheet of predetermined thickness is placed on the heat transfer surface of the first electronic element 32, and with the heat transfer plate 54 placed thereon, the spacers 94 are set in position. After bonding the spacers 94, the heat transfer plate 54 is removed together with the spacers 94, and a compound is coated on the heat transfer surface of the first electronic element 32. Then, the heat radiating plate 54 is mounted together with the spacers 94 and fixed by screws 108. The cooling member 56 is fixed on the heat transfer plate 54 by screws 60.

FIGS. 29 to 36 are views for explaining the cooling of the second electronic elements 34a. The first electronic element 32 making up a CPU is cooled by bringing the cooling member 56 into direct contact with the heat radiating plate 54. The second electronic elements 34a for a RAM, in contrast, is cooled by air, without bringing the cooling member 114 into contact with the second electronic elements 34a.

FIG. 29 is a view showing an example of cooling the second electronic elements 34a. As described above, the second electronic element group 34 includes a plurality of second electronic elements 34a arranged in lines, and each second electronic element 34a comprises RAM semiconductor chips 110 mounted to a printed board 112. The printed board 112 is arranged in the direction perpendicular to the motherboard 30, and an end of the printed board 112 is mounted to the motherboard.

Like the cooling member 56, the cooling members 114 supplied with a refrigerant through hoses 38 inserted between the second electronic elements 34a. Specifically, the cooling members 114 are arranged in the vicinity of the second electronic elements 34a and cooled by cooling air. The second electronic elements 34a are cooled in this way, and the air thus heated has the effect of reducing the humidity in the box structure 26.

Figure 30:
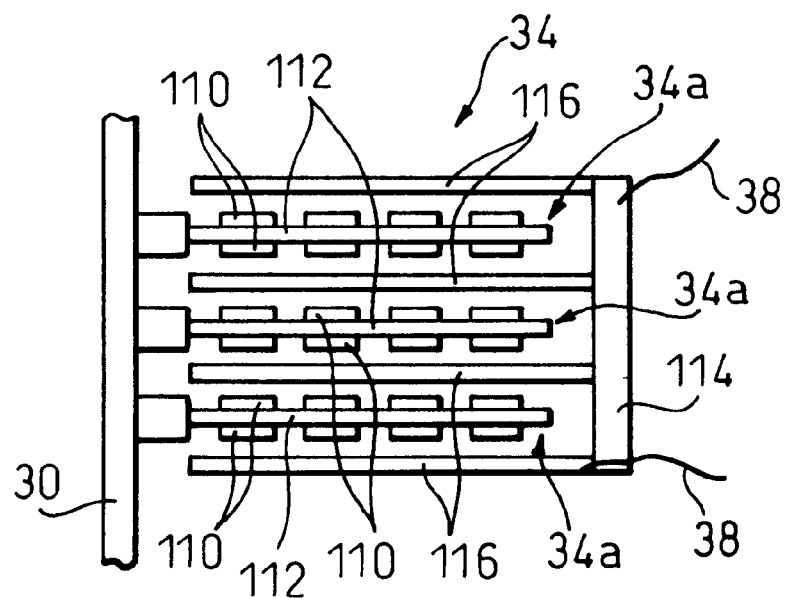
FIG. 30 is a view showing another example of cooling the second electronic elements.

FIG. 30 is a view showing still another example of the cooling of the second electronic elements 34a. In this example, the cooling member 114 is arranged substantially outside of the lines (second electronic element group 34) of the second electronic elements 34a, heat conductors 116 are connected to the cooling member 114 and inserted between the second electronic elements 34a. In this way, the second electronic elements 34a are cooled by the cooling member 114 and the heat conductors 116 through an air layer.

Figure 31:
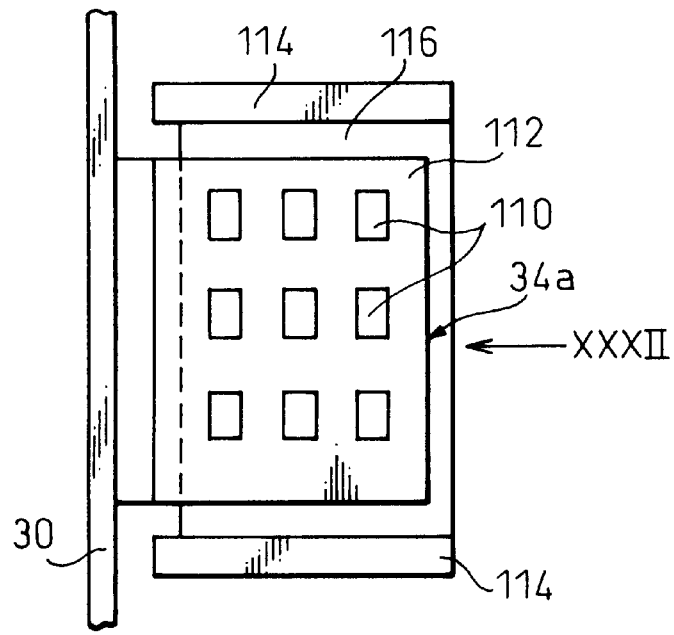
FIG. 31 is a view showing still another example of cooling the second electronic elements.
Figure 32:
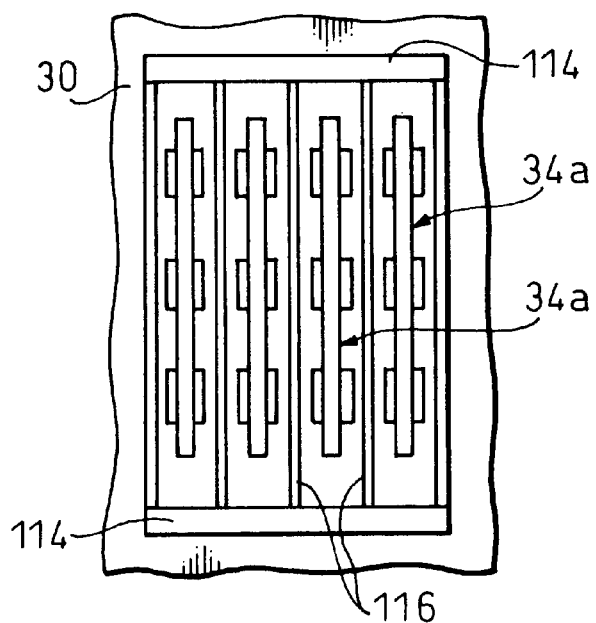
FIG. 32 is a side view from the arrow of FIG. 31.

FIGS. 31 and 32 are views showing still another example of cooling the second electronic elements 34a. In this example, the cooling members 114 are arranged substantially outside of the lines of the second electronic elements 34a (second electronic element group 34), the heat conductors 116 are connected to the cooling members 114 and inserted between the second electronic elements 34a. In FIG. 30, the cooling member 114 is arranged in parallel to the motherboard 30, whereas in FIGS. 31 and 32, the cooling members 114 are arranged in the direction perpendicular to the motherboard 30, and the two cooling members 114 are located on the two sides of the second electronic element group 34. With this configuration, not only the second electronic elements 34a can be cooled as described above, but also the second electronic elements 34a can be inserted or removed with the cooling members 114 and the heat conductors 116 kept intact.

Figure 33:
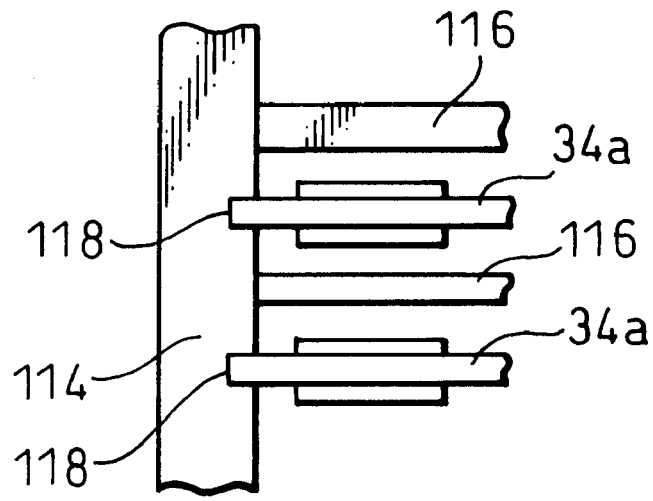
FIG. 33 is a view showing another example of cooling the second electronic elements.

FIG. 33 is a view showing a further example of the cooling of the second electronic elements 34a. The cooling members 114 and the heat conductors 116 are arranged in a manner similar to FIGS. 31 and 32. In this example, however, the cooling member 114 has rails 118 for inserting the second electronic elements 34a into a connector arranged on the motherboard 30. Specifically, the cooling member 114 and the second electronic elements 34a are movable relatively to each other in the direction perpendicular to the page (the horizontal direction in the page of FIG. 31). When the cooling member or the heat conductors 116 are inserted or unloaded, or when the second electronic elements 34a are inserted or unloaded, the inclination of the second electronic elements 34a is suppressed thereby to prevent the cooling member 114 and the heat conductor 116 from contacting the second electronic elements 34a.

Figure 34:
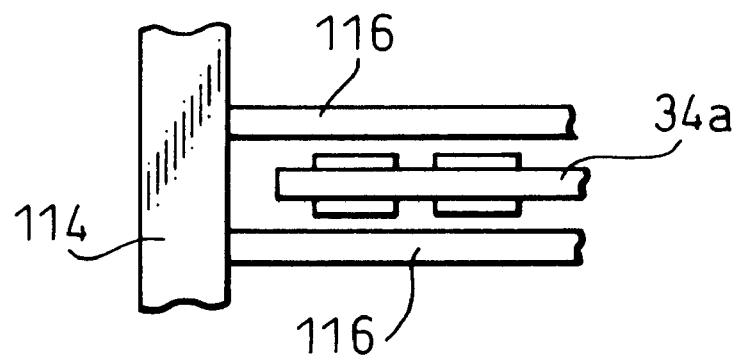
FIG. 34 is a view showing still another example of cooling the second electronic elements.

FIG. 34 is a view showing a yet further example of cooling the second electronic element 34a. In this example, the cooling member 114 and the heat conductors 116 are arranged in a manner similar to FIGS. 31 and 32, and a heat pipe is inserted in the heat conductors 116. As a result, the heat transfer capacity from the second electronic element 34a to the cooling member 114 is enhanced.

Figure 35:
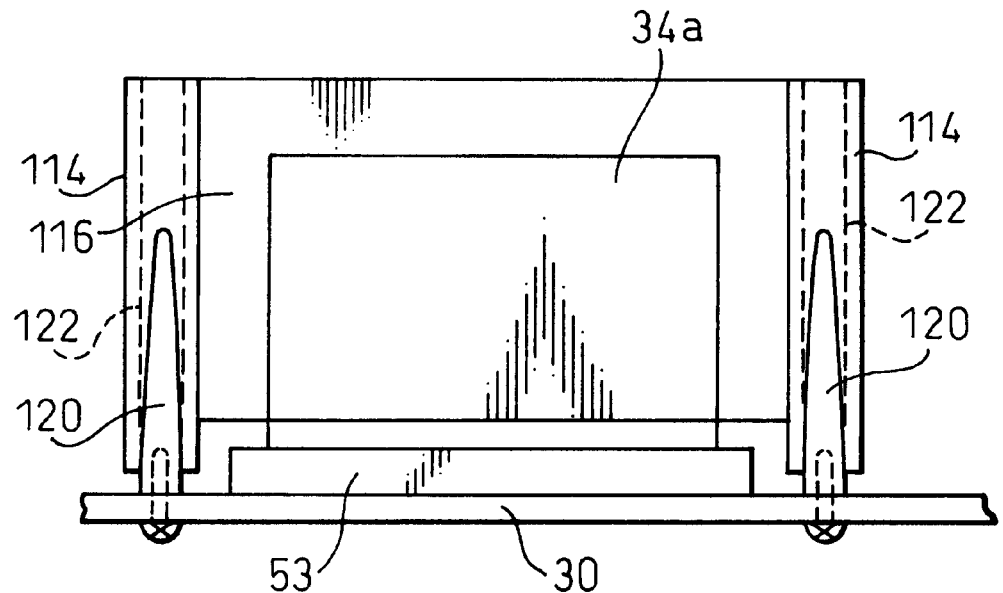
FIG. 35 is a view showing a further example of cooling the second electronic elements.

FIG. 35 is a view showing still another example of cooling the second electronic element 34a. The cooling members 114 and the heat conductor 116 are arranged in a manner similar to FIGS. 31 and 32. In this example, pins 120 are arranged in parallel to the second electronic element 34a and the cooling members 114 on the motherboard 30, and holes 122 through which the pins 120 are applied are formed in the cooling members 114 or a member integrated therewith. When the cooling member holding mechanism 36 is moved and the heat conductor 116 is inserted between the second electronic elements 34a, therefore, the pins 120 act as a guide and set the second electronic elements 34a and the cooling members 114 in position thereby to prevent the second electronic elements 34a and the cooling members 114 from contacting each other.

Figure 36:
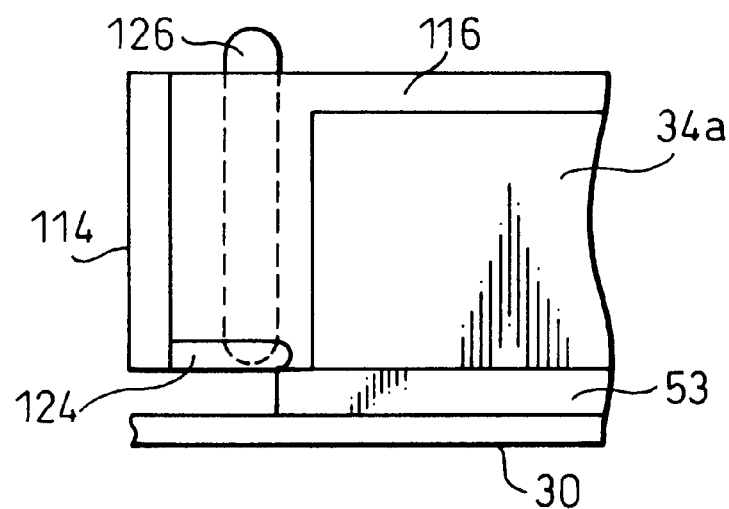
FIG. 36 is a view showing a yet further example of cooling the second electronic elements.

FIG. 36 is a view showing still another example of cooling the second electronic element 34a. The cooling member 114 and the heat conductor 116 are arranged in a similar manner to FIGS. 31 and 32. In this example, a latch mechanism 124 of a connector 53 for the second electronic element 34a is operable by a tool 126, so that the second electronic element 34a can be inserted or unloaded with the cooling member 114 and the heat conductor 116 kept intact.

Figure 37:
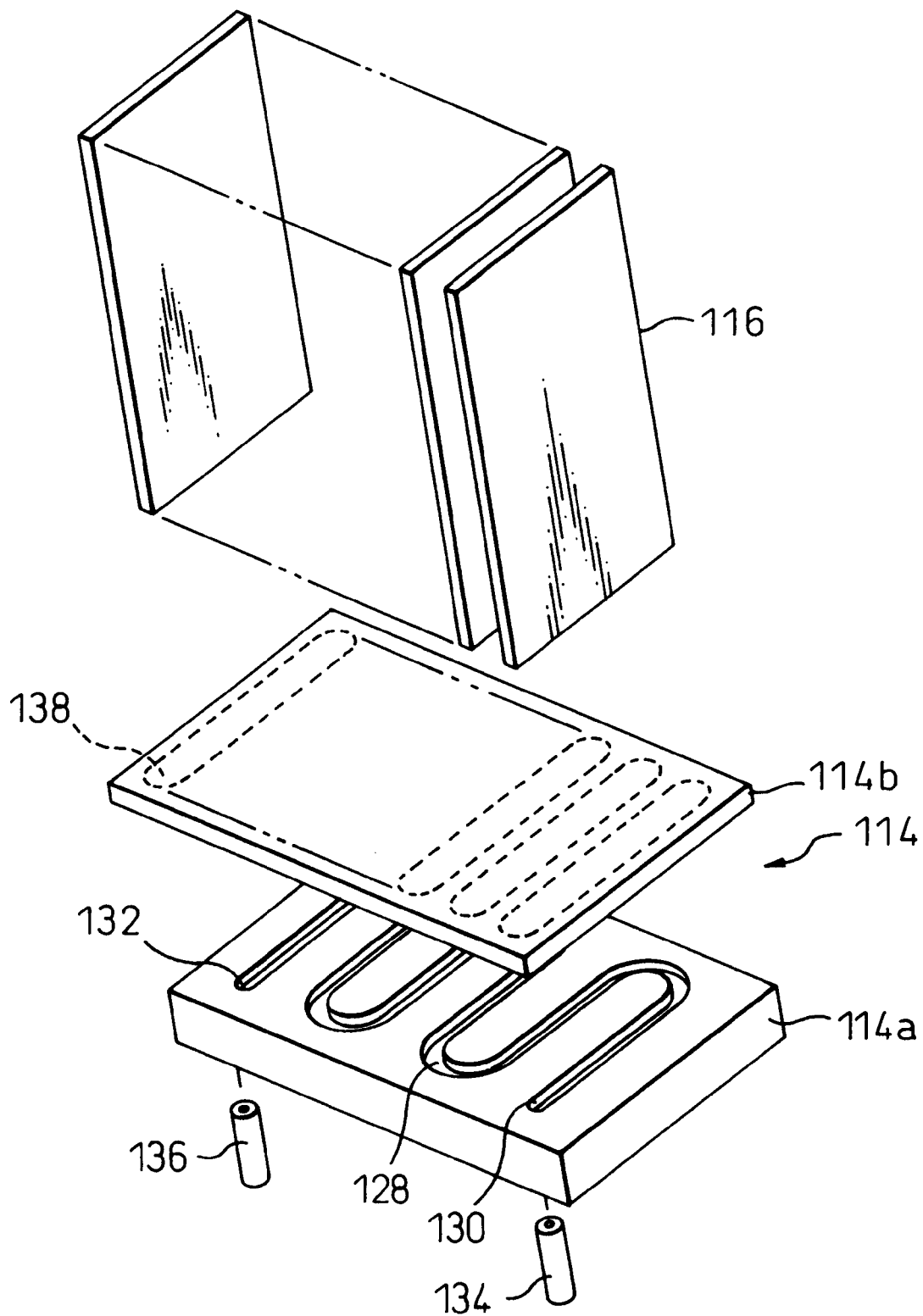
FIG. 37 is a view showing an example of the structure of the cooling member for the second electronic elements.

FIG. 37 is a view showing an example structure of the cooling member 114 for the second electronic element 34a. Like the cooling member 56 shown in FIGS. 20 and 21, the cooling member 114 includes two plate members 114a, 114b overlaid and coupled by brazing or the like. The cooling member 114 has a refrigerant path 128, a refrigerant inlet 130 and a refrigerant outlet 132. The refrigerant path 128 is formed as a groove in the surface of a plate member 114a. The refrigerant inlet 130 and the refrigerant outlet 132 have nipples 134, 136 mounted thereon.

Further, a heat conductor 116 made of a metal plate is brazed at a position designated by 138 on the outer surface of a plate member 114b.

Figure 38:
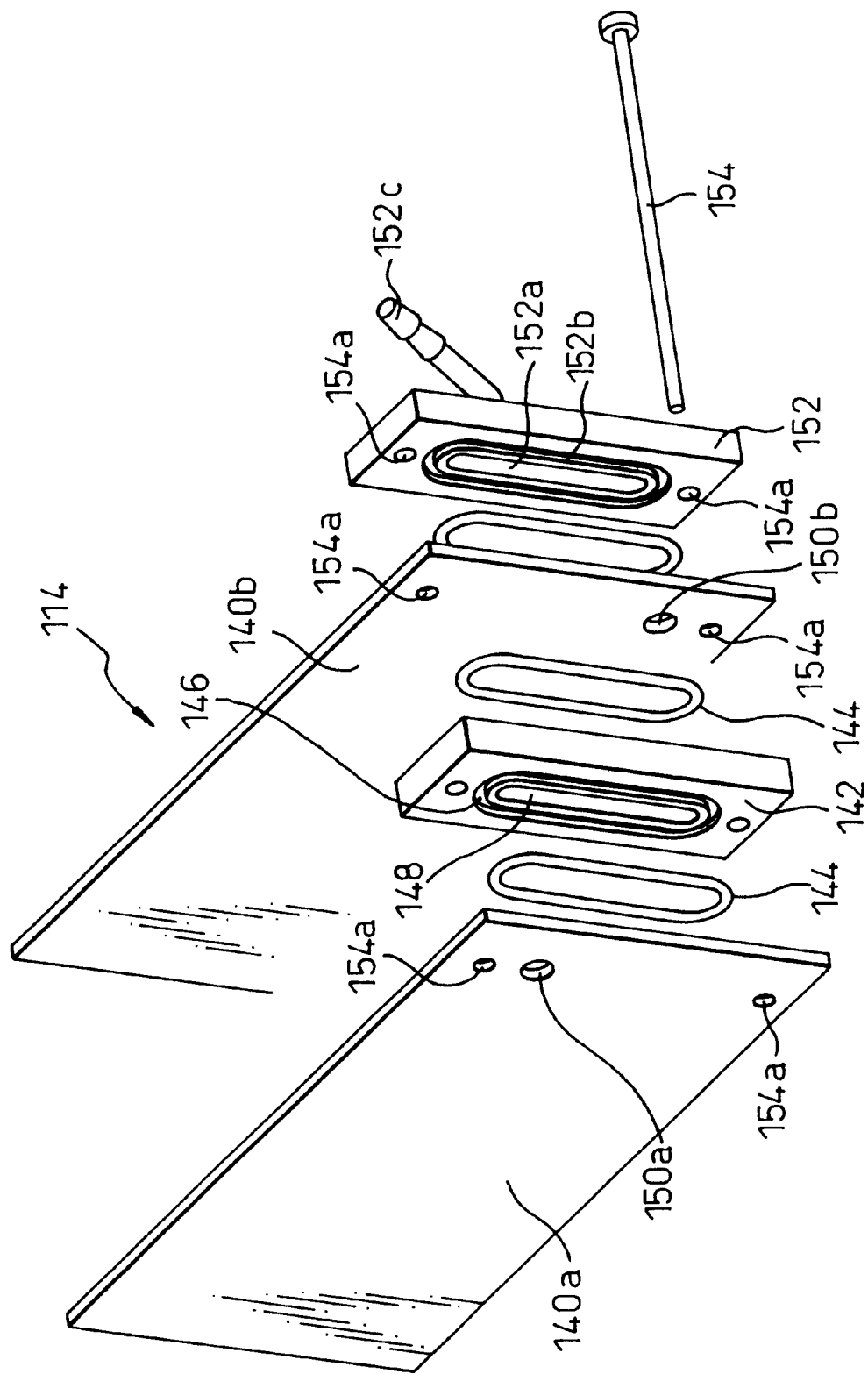
FIG. 38 is a view showing another example of the structure of the cooling member for the second electronic elements.

FIG. 38 is a view showing still another example of the structure of the cooling member 114 for the second electronic elements 34a. In this example, the cooling member 114 includes a first plate 140a, a second plate 140b and a spacer 142 arranged between the first and second plates. The first plate 140a, the spacer 142 and the second plate 140b are coupled hermetically to each other through seal rings 144.

The spacer 142 has annular grooves 146 for arranging the seal rings 144 and a through hole 148 for forming a refrigerant path. The first plate 140a and the second plate 140b have through holes 150a, 150b forming a part of the refrigerant path. The through hole 148 of the spacer 142 is formed inside the annular grooves 146. The through holes 150a, 150b of the first and second plates 140a, 140b are arranged vertically staggered, and are formed in such a manner as to be located in the annular grooves 146 when the first plate 140a, the spacer 142 and the second plate 140b are coupled to each other.

Figure 39:
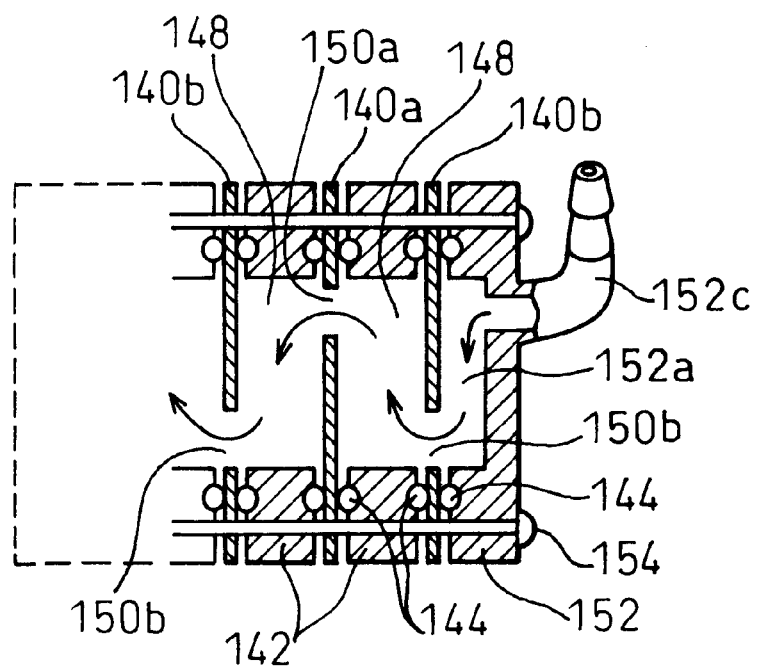
FIG. 39 is a cross-sectional view showing the refrigerant path in the configuration of FIG. 38.

Further, as shown in FIGS. 38 and 39, the first plate 140a, the spacer 142 and the second plate 140b are combined with a spacer 142 and a third plate. The third plate has fundamentally the same structure as the first plate 140a or the second plate 140b. As a result, a hermetic multilayer assembly is formed of the second plate 140b, the spacer 142, the first plate 140a, the spacer 142 and the second plate 140b. The number of layers in this multilayer assembly can be changed.

An end plate 152 is arranged at an end of this multilayer assembly. The end plate 152 includes a groove 152a forming a part of the refrigerant path, an annular groove 152b for the seal ring 144 and an inlet/outlet. A nipple 152c is mounted on the inlet/outlet. An end plate (not shown) similar to the end plate 152 is arranged at the other end of this multilayer assembly. The multilayer assembly including the first plate 140a, the spacer 142 and the second plate 140b (and the third plate 140c) is integrated by a bolt 154. The bolt 154 is inserted in an insertion hole 154a and screwed to a nut (not shown)

The refrigerant that has entered by way of the nipple 152b of the end plate 152, therefore, can flow in a zigzag path along the refrigerant path formed of the groove 152a, the through holes 150a, 150b and the through hole 148.

Further, as clear from FIG. 38, the first and second plates 140a, 140b are larger than the spacer 142, and the portion of the first and second plates 140a, 140b that expands outside beyond the spacer 142 (outside beyond the multilayer assembly) acts as a heat conductor 116. Specifically, the portion of the first and second plates 140a, 140b and the spacer 142 constituting the multilayer assembly acts as the cooling member 114 of FIGS. 29 to 36, for example, and the portion of the first and second plates 140a, 140b expanding outside act as the heat conductor 116 of FIGS. 30 to 36, for example.

Figure 40:
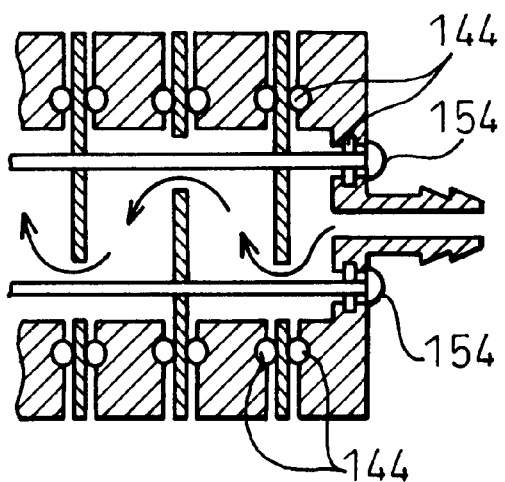
FIG. 40 is a cross-sectional view showing the refrigerant path in the configuration of FIG. 41.
Figure 41:
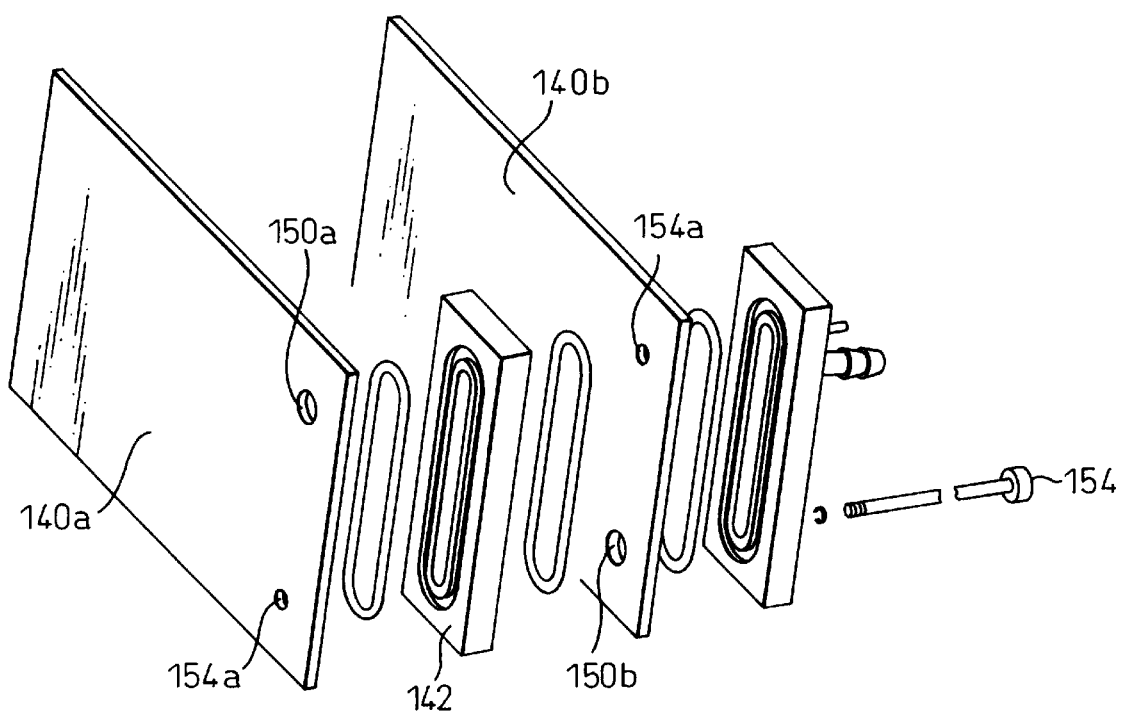
FIG. 41 is a view showing another example of the structure of the cooling member for the second electronic elements.

FIGS. 40 and 41 show still another example of the structure of the cooling member 114 for the second electronic elements 34a. The fundamental configuration of this embodiment is similar to that of the preceding embodiments. In the embodiment of FIGS. 38 and 39, the bolt 154 is arranged outside of the seal rings 144. In this embodiment, however, the bolt 154 is arranged inside of the seal rings 144. The through holes 150a, 150b can double as a part of the insertion holes 154a.

Figure 42:
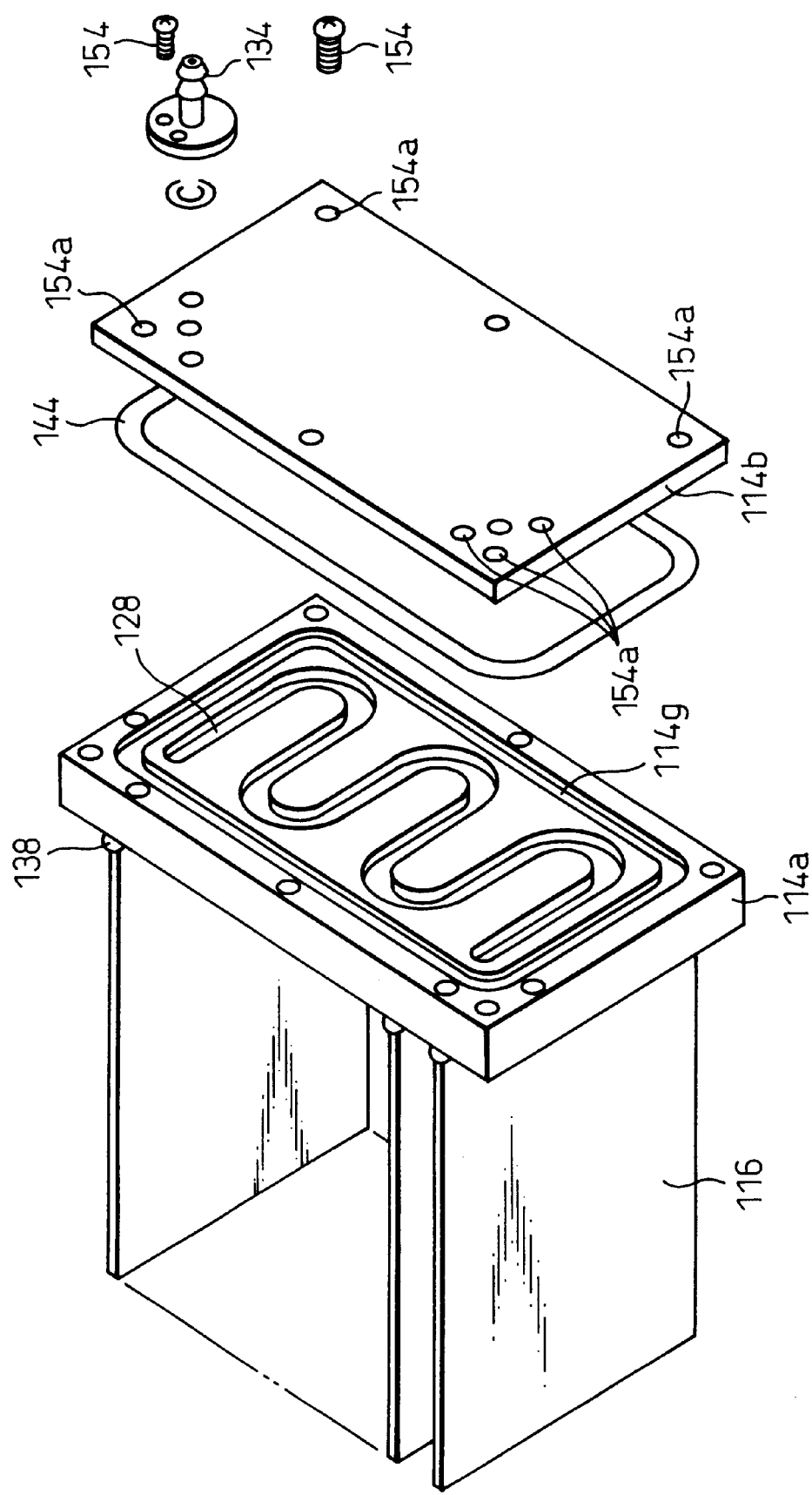
FIG. 42 is a view showing still another example of the structure of the cooling member for the second electronic elements.

FIG. 42 is a view showing still another example of the structure of the cooling member 114 for the second electronic elements 34a. In this embodiment, the feature of the embodiment of FIG. 37 is combined with the feature of the embodiment of FIG. 38. The cooling member 114 is formed of two plate members 114a, 114b laid one on the other through the seal ring 144, and the two plate members 114a, 114b are integrated by bolts 154. The nipples 134 are also mounted by the bolts 154. The heat conductor 116 is fixed on the plate member 114a by the brazing 138.

In FIGS. 37 to 42, the configuration (FIG. 37) in which the plate members 114a, 114b making up the cooling member 114 are coupled by brazing is compact and can be fabricated easily. At the time of brazing, however, the plates 114a, 114b are heated, and therefore may be softened and deformed. Also, once brazed, the plates 114a, 114b are difficult to repair when the refrigerant path is clogged. The configuration in which the plates 140a and 140b are laid one on the other by way of the seal rings 144 and coupled to each other by the bolts 154 or the like, in contrast, can solve the problem of the brazing.

Figure 43:
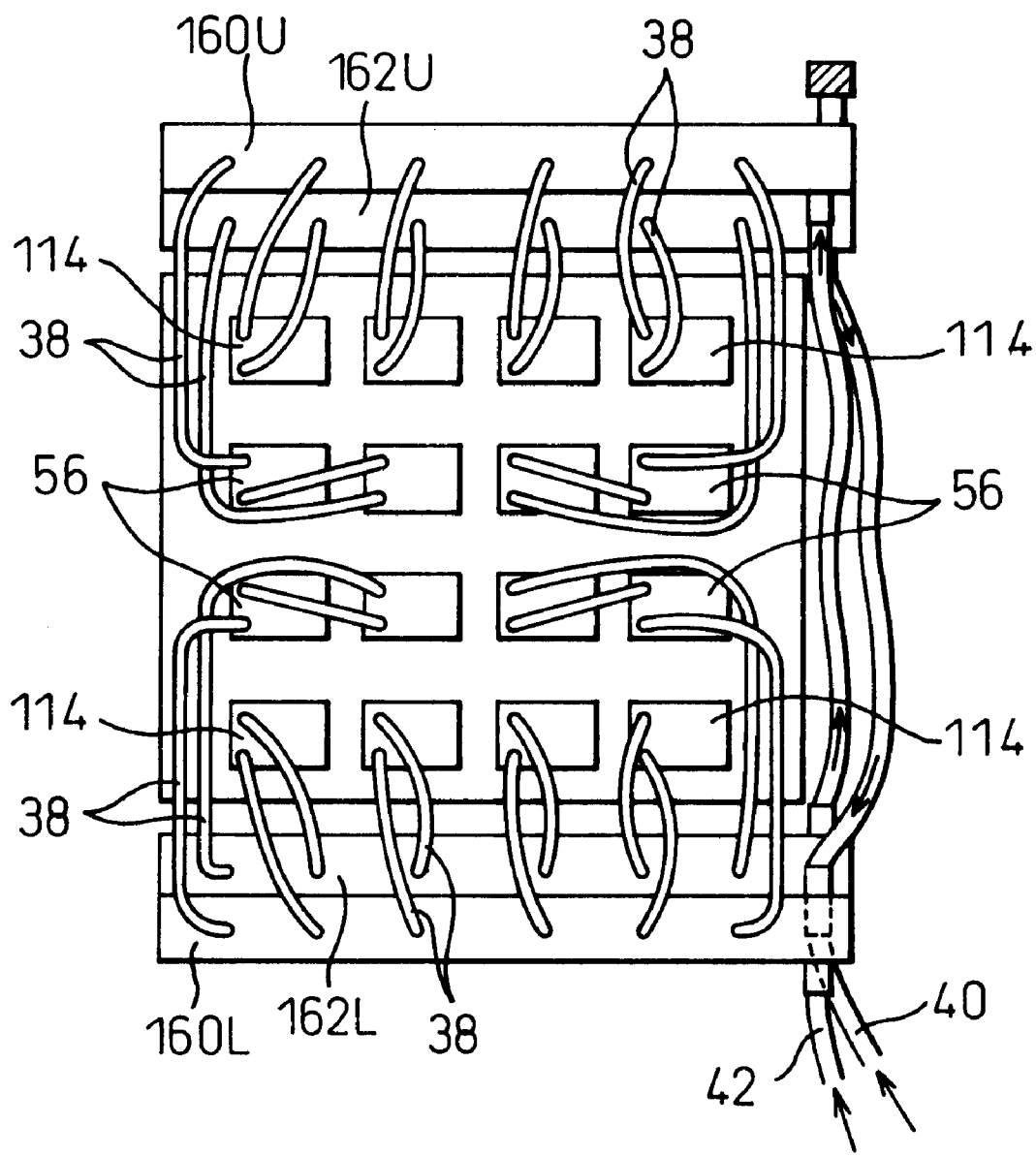
FIG. 43 is a view showing an example of arrangement of the hoses of the refrigerant supply means in the cooling member holding mechanism.

FIG. 43 is a view showing an example of arrangement of the hoses 38 of the refrigerant supply means in the cooling member holding mechanism 36. A manifold 160L for supplying the refrigerant and a manifold 162L for discharging the refrigerant are mounted horizontally at the lower end of the cooling member holding mechanism 36. Further, a manifold 160U for supplying the refrigerant and a manifold 162L for discharging the refrigerant are mounted horizontally at the upper end of the cooling member holding mechanism 36. The hoses 40 and 42 extending from the refrigeration unit 16 shown in FIG. 2 are connected to the manifolds 160L, 162L, 160U and 162U.

FIG. 43 shows the cooling members 56 and 114 arranged in four lines to facilitate the understanding. For the cooling member 114 in the uppermost stage, the hoses 38 are connected in parallel to each other in the direction substantially perpendicular to the upper-stage manifolds 160U and 162U. For the cooling member 56 in the second stage, on the other hand, the hoses 38 are connected in the direction substantially perpendicular to the upper-stage manifolds 160U and 162U on the one hand and extend horizontally in the area of the cooling member 56 on the other, with the hoses 38 of adjacent cooling members 56 being serially connected.

For the third-stage cooling member 56, the hoses 38 are connected in the direction substantially perpendicular to the low-stage manifolds 160L and 162L and extend horizontally in the area of the cooling member 56, with the hoses 38 of adjacent cooling members 56 being connected serially to each other. For the lowest-stage cooling member 114, the hoses 38 are connected in the direction substantially perpendicular to the low-stage manifolds 160L and 162L, with the hoses 38 of adjacent cooling members 114 being connected in parallel to each other.

Therefore, the hoses 38 of given cooling members 56 and 114 are prevented from crossing other cooling members 56 and 114 in the direction perpendicular thereto. Therefore, the hoses 38 form no hindrance when the cooling members 56 and 114 perform the open/close operation around the horizontal axis as shown in FIGS. 12 and 13. Thus, the maintenance and replacement work of the electronic elements 32 and 34a are facilitated.

Figure 44:
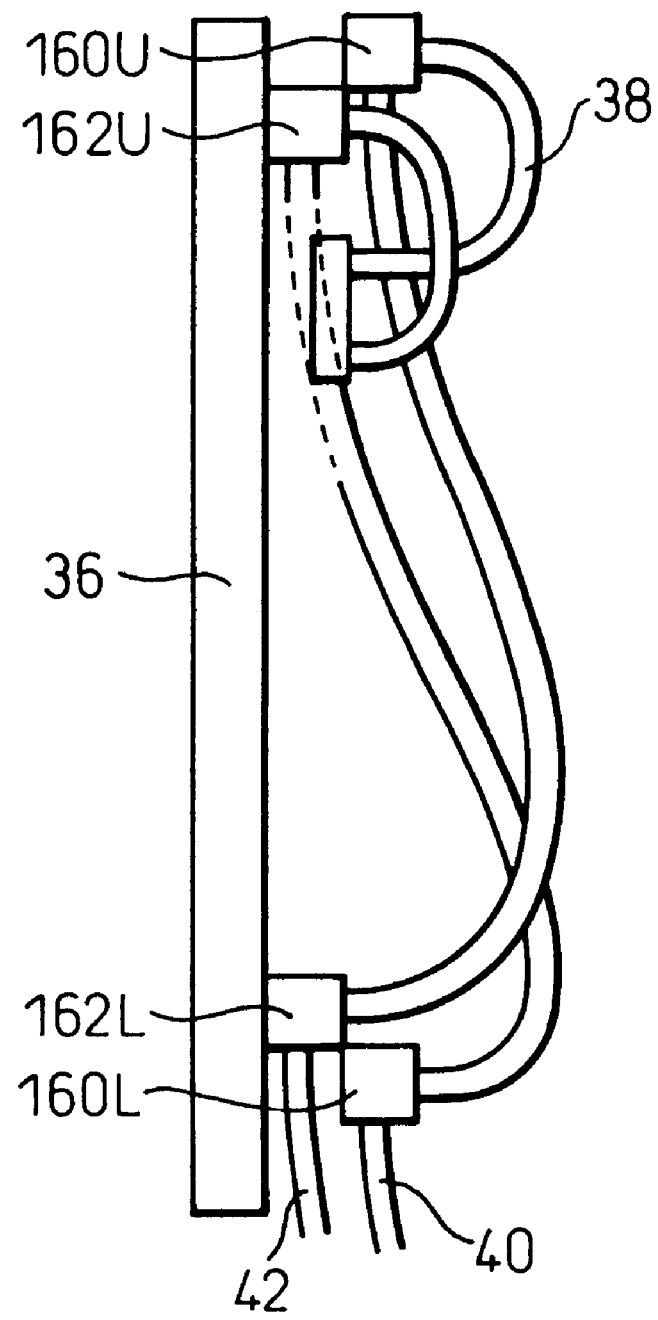
FIG. 44 is a side view of the manifold in FIG. 43.

Further, as shown in FIG. 44, the upper-stage manifolds 160U and 162U are arranged in a staggered fashion, and so are the low-stage manifolds 160L and 162L. This piping arrangement effectively simplifies the piping work of the hoses 38 using the same manifolds 160U, 162U, 160L and 162L and can realize the above-mentioned feature.

Figure 45:
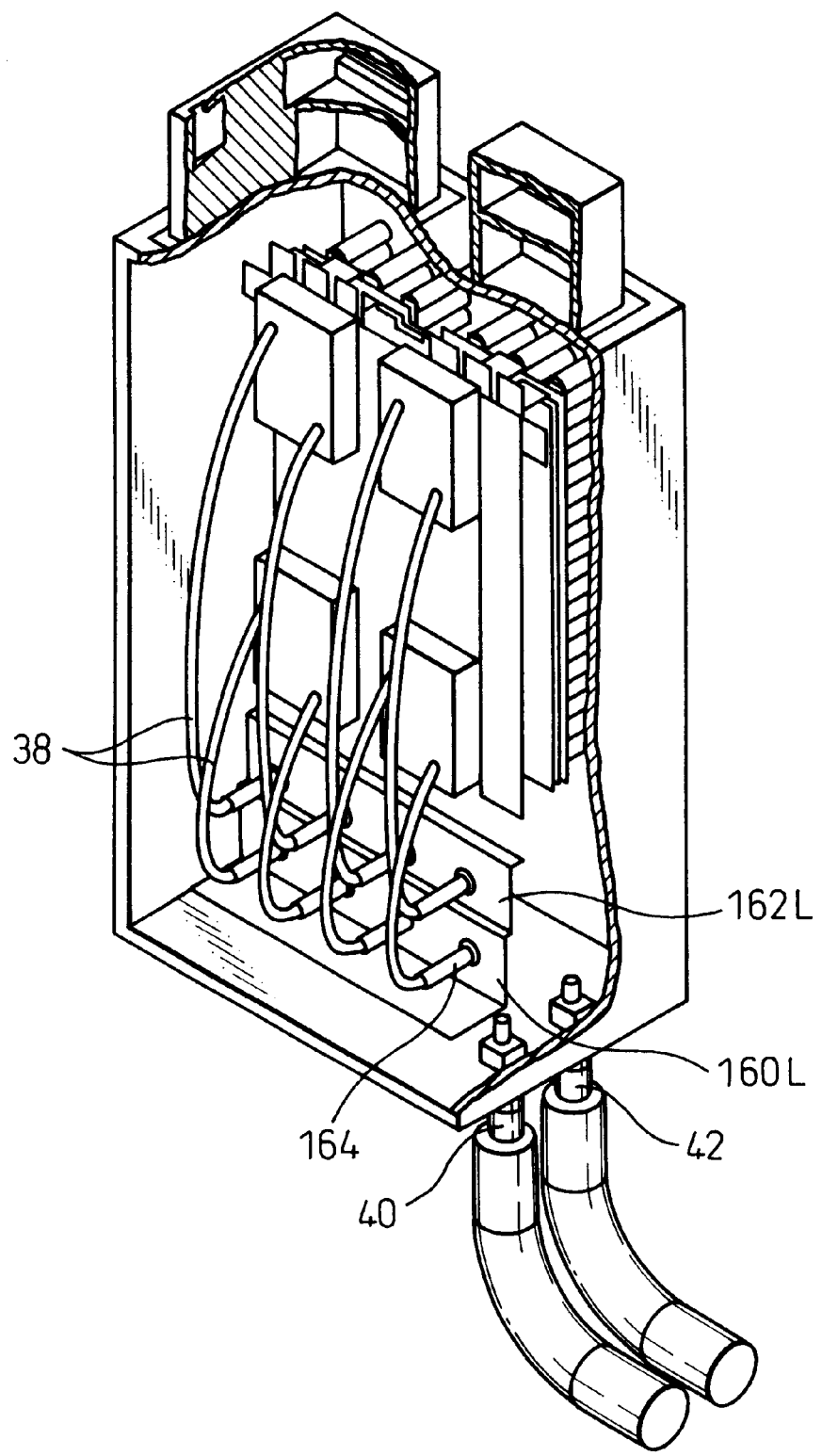
FIG. 45 is a view showing another example of arrangement of the hoses of the refrigerant supply means in the cooling member holding mechanism.

FIG. 45 is a view showing still another example of arrangement of the hoses 38 of the refrigerant supply means in the cooling member holding mechanism 36. In this example, the hoses 38 are connected to the manifolds 160L and 162L by way of couplers 164. The manifolds and the hoses can be alternatively configured as shown in FIG. 43.

Figure 46:
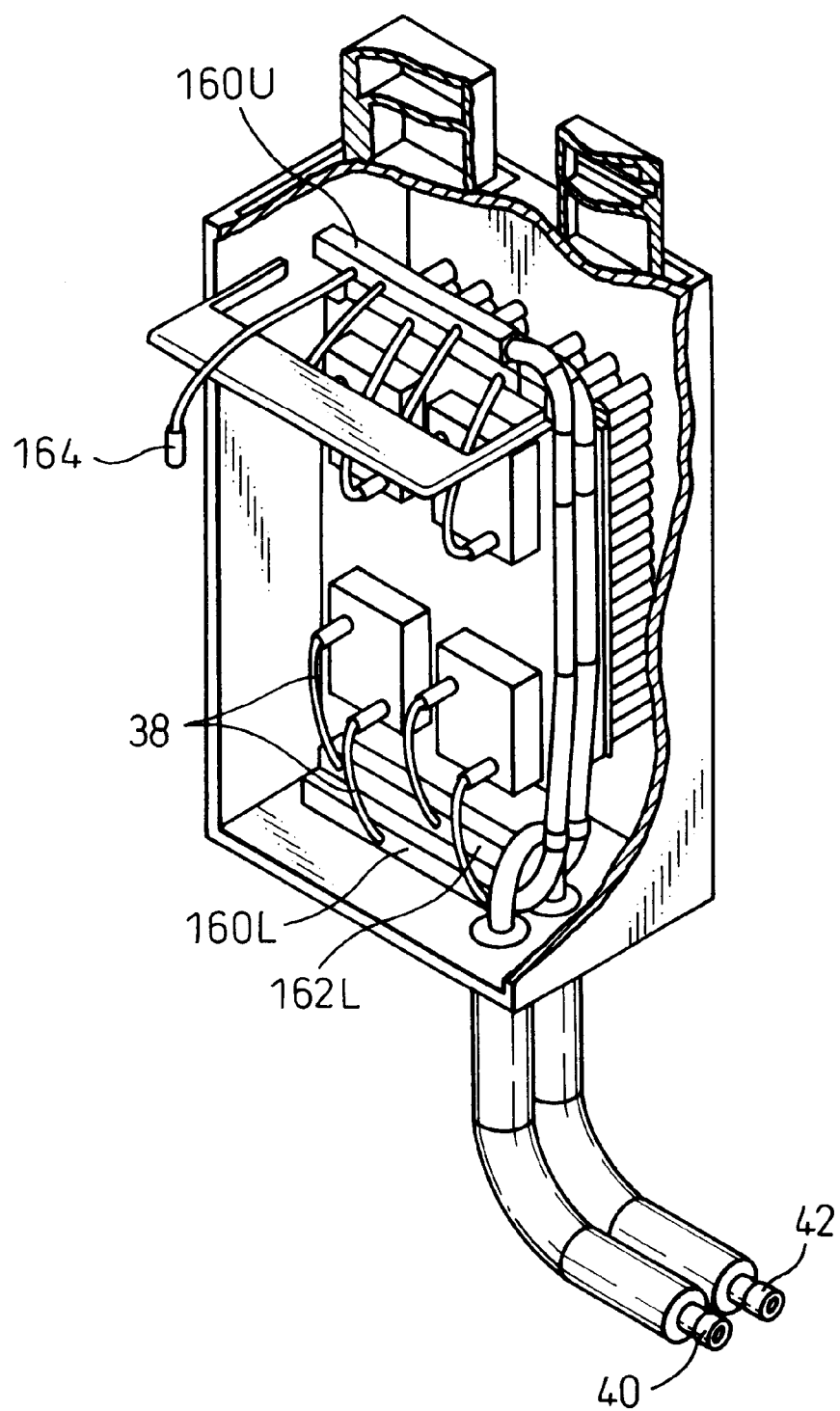
FIG. 46 is a view showing still another example of arrangement of the hoses of the refrigerant supply means in the cooling member holding mechanism.
Figure 47:
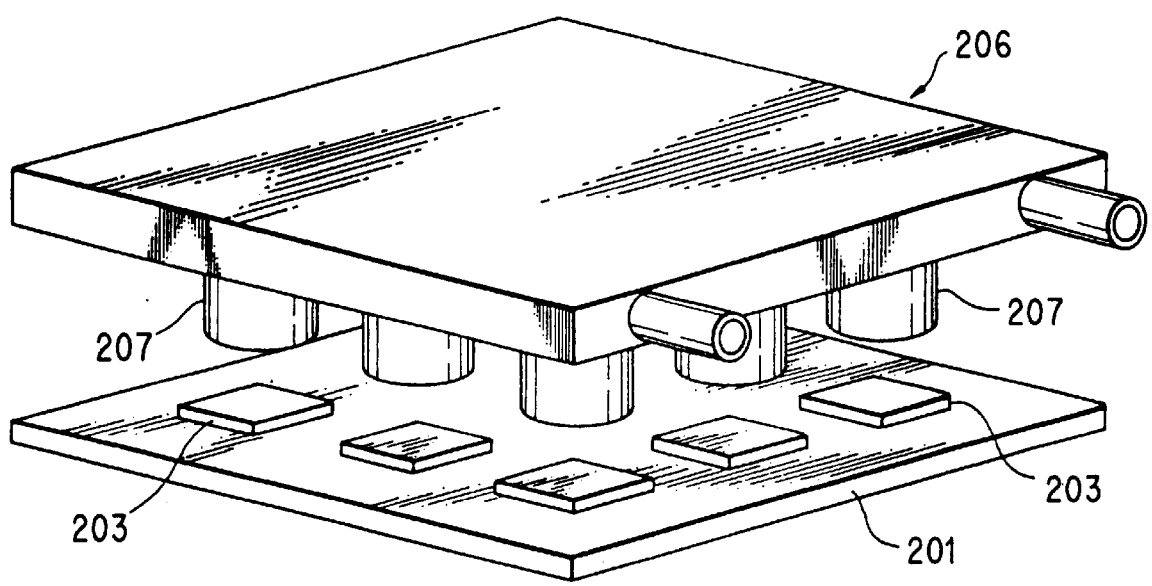
FIG. 47 is a view showing a conventional liquid cooling structure.
Figure 48:
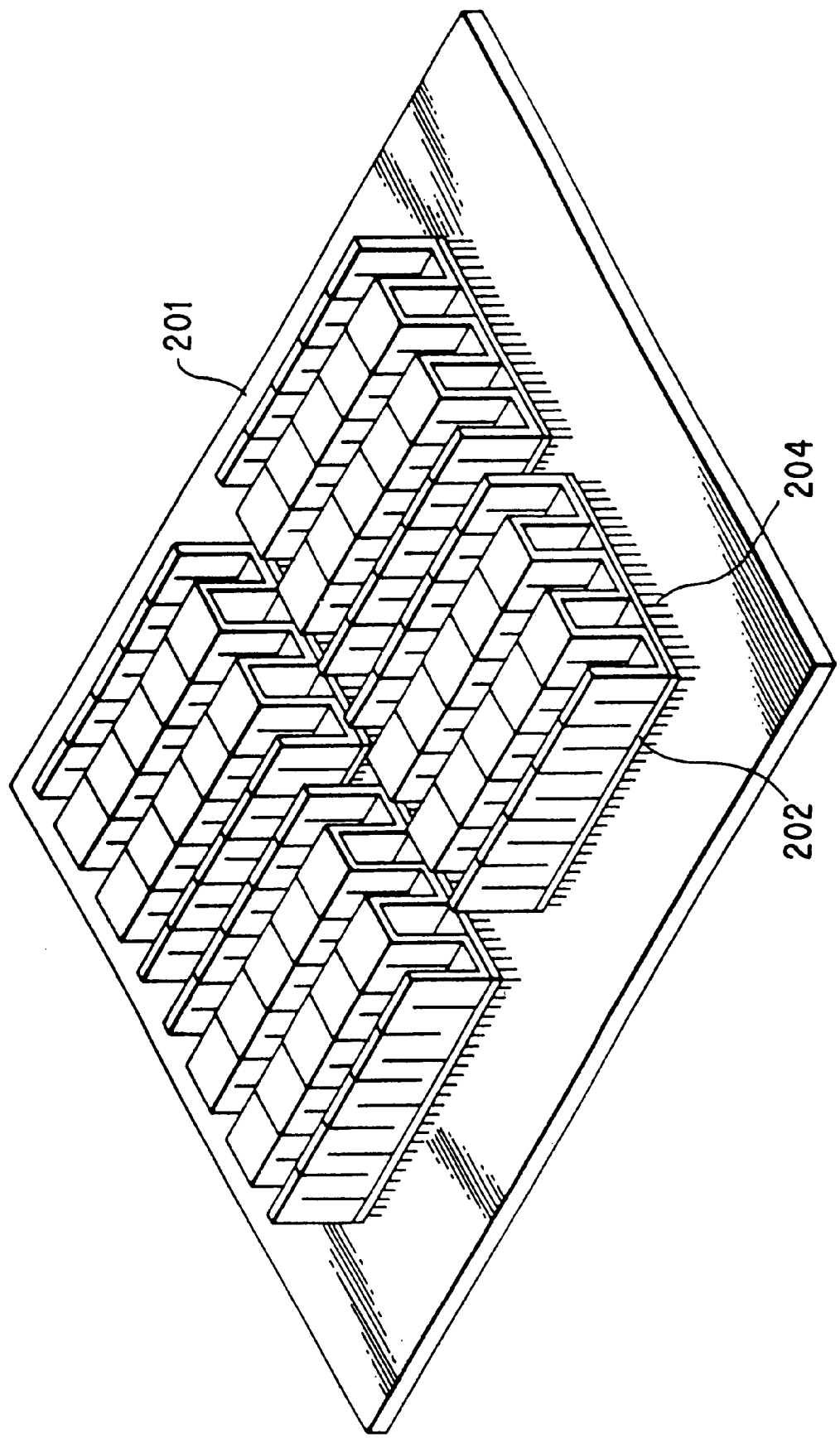
FIG. 48 is a view showing a conventional forced air-cooling structure.

FIG. 46 is a view showing still another example of arrangement of the hoses 38 of the refrigerant supply means in the cooling member holding mechanism 36. In this example, the hoses 38 are connected to the manifold 160 by couplers 164. Further, a stopper is arranged in each coupler 164. Thus, the hoses 38 and the cooling members can be separated from each other without draining the refrigerant.

As described above, according to this invention, a computer with a multi-chip module mounted to the motherboard is cooled using a cooling member of a temperature lower than the room temperature. Thus, the operation at high clock frequency is made possible, and the maintenance work, including the replacement of the multi-chip module, is facilitated.

What is claimed is:

1. An electronic apparatus comprising a motherboard, a number of multi-chip modules mounted to said motherboard, a plurality of cooling members corresponding in number to the number of modules for cooling said multi-chip modules, a refrigeration unit circulating cooling medium for cooling said cooling members, a cooling member holding mechanism for collectively holding said plurality of cooling members, and means for communicating said refrigeration unit with said cooling member holding mechanism for cooling said cooling members to a temperature not higher than room temperature.

2. An electronic apparatus according to claim 1, further comprising heat radiation members mounted to said multi-chip modules, and fixing members for fixing the cooling members to said heat radiation members with said cooling members contacting said heat radiation members.

3. An electronic apparatus comprising a motherboard, multi chip modules mounted to said motherboard, cooling members for cooling said multi-chip-modules, a refrigeration unit for cooling said cooling members to a temperature not higher than room temperature, a cooling member holding mechanism for collectively holding said cooling members, said electronic apparatus further comprising heat radiation members mounted to said multi-chip modules, and fixing members for fixing the cooling members to said heat radiation members with said cooling members contacting said heat radiation members, wherein said cooling members are floatably supported by said cooling member holding mechanism.

4. An electronic apparatus comprising a motherboard, multi-chip modules mounted to said motherboard, cooling members for cooling said multi-chip modules, a refrigeration unit for cooling said cooling members to a temperature not higher than room temperature, and a cooling member holding mechanism for collectively holding said cooling members, wherein said cooling member holding mechanism is movable together with the cooling members toward and away from said motherboard.

5. An electronic apparatus according to claim 4, wherein said cooling member holding mechanism is movable wholly along a slide mechanism.

6. An electronic apparatus according to claim 4, wherein said cooling member holding mechanism is movable wholly around a supporting point.

7. An electronic apparatus according to claim 3, wherein said cooling member holding mechanism includes movable portions formed in such a manner as to move toward and away from said motherboard together with each of said cooling members.

8. An electronic apparatus according to claim 7, wherein said motherboard has connectors, and said multi-chip modules have connecting pins engageable with said connectors, said connectors having mounting and demounting means for releasably securing said connecting pins in said connectors, said cooling member holding mechanism having rotary cooling member holding sections containing said movable portions for holding said cooling members for rotation therewith, said movable portion of said rotary cooling member holding section being operatively connected to said mounting and demounting means.

* * * * *

UNITED STATES PATENT AND TRADEMARK OFFICE
CERTIFICATE OF CORRECTION

PATENT NO.     : 6,404,640 B1
DATED          : June 11, 2002
INVENTOR(S)    : Ishimine et al.

It is certified that error appears in the above-identified patent and that said Letters Patent is hereby corrected as shown below:

<u>Title page,</u>
Item [75], Inventors, change "Junichi Ishimine; Masahiro Suzuki; Masahiro Miyo; Akihiko Fujisaki; Keizo Takemura; Jie Wie; Hisashi Kawashima; Yoshiaki Udagawa; Haruhiko Yamamoto; Masahiro Mochizuki, all of Kawaski (JP)" to be -- Masahiro Miyo; Akihiko Fujisaki; Keizo Takemura; Jie Wei; Haruhiko Yamamoto; Masahiro Mochizuki, all of Kawaski (JP) --

Signed and Sealed this

First Day of April, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,404,640 B1
DATED : June 11, 2002
INVENTOR(S) : Ishimine et al.

It is certified that error appears in the above-identified patent and that said Letters Patent is hereby corrected as shown below:

<u>Title page,</u>
Item [75], Inventors, change "Junichi Ishimine; Masahiro Suzuki; Masahiro Miyo; Akihiko Fujisaki; Keizo Takemura; Jie Wie; Hisashi Kawashima; Yoshiaki Udagawa; Haruhiko Yamamoto; Masahiro Mochizuki, all of Kawaski (JP)" to be -- Junichi Ishimine; Masahiro Suzuki; Akira Tamura; Hisashi Kawashima; Yoshiaki Udagawa, all of Kawaski (JP) --

This certificate supersedes Certificate of Correction issued April 1, 2003.

Signed and Sealed this

First Day of July, 2003

JAMES E. ROGAN
*Director of the United States Patent and Trademark Office*